(12) United States Patent
Birkbeck et al.

(10) Patent No.: US 12,184,255 B2
(45) Date of Patent: *Dec. 31, 2024

(54) LOW LOSS REFLECTIVE PASSIVE PHASE SHIFTER USING TIME DELAY ELEMENT WITH DOUBLE RESOLUTION

(71) Applicant: Murata Manufacturing Co., Ltd., Kyoto (JP)

(72) Inventors: John Birkbeck, New Milton (GB); Vikas Sharma, Reading (GB); Kashish Pal, Reading (GB); Mark James O'Leary, San Diego, CA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/355,327

(22) Filed: Jul. 19, 2023

(65) Prior Publication Data
US 2024/0030897 A1 Jan. 25, 2024

Related U.S. Application Data

(63) Continuation of application No. 17/094,654, filed on Nov. 10, 2020, now Pat. No. 11,711,068, which is a
(Continued)

(51) Int. Cl.
*H03H 11/20* (2006.01)
*H03H 11/26* (2006.01)
(Continued)

(52) U.S. Cl.
CPC .......... *H03H 11/20* (2013.01); *H03H 11/265* (2013.01); *H03H 17/0009* (2013.01); *H03H 17/0054* (2013.01); *H03H 17/08* (2013.01)

(58) Field of Classification Search
CPC .. H03H 11/20; H03H 11/265; H03H 17/0009; H03H 17/0054; H03H 17/08; H03H 7/18; H03H 7/20; H01P 1/184
See application file for complete search history.

(56) References Cited

U.S. PATENT DOCUMENTS 3,516,024 A    6/1970  Lange
3,611,199 A   10/1971  Safran
(Continued)

FOREIGN PATENT DOCUMENTS

WO    2017119948    7/2017
WO    2020257212   12/2020

OTHER PUBLICATIONS

Glenn, Kimberly E., Office Action received from the USPTO dated Nov. 16, 2017 for U.S. Appl. No. 14/988,463, 24 pgs.
(Continued)

*Primary Examiner* — Andrea Lindgren Baltzell
*Assistant Examiner* — Kimberly E Glenn
(74) *Attorney, Agent, or Firm* — .Haynes and Boone, LLP

(57) ABSTRACT

A phase shifter for altering the phase of a radio frequency signal is disclosed herein. A Lange coupler is used having reflective ports that are coupled to artificial transmission lines. The artificial transmission lines provide a reflection transmission path, the length of which can be determined by digital control lines. Transistors placed along the length of the central trace provide independent paths to ground that serve to shorten the electrical length of the ATL. Accordingly, by selectively turning the transistors on/off, the electrical length of the ATL can be selected and thus the amount of phase delay introduced by the phase shifter.

20 Claims, 28 Drawing Sheets

Related U.S. Application Data continuation of application No. 16/372,194, filed on Apr. 1, 2019, now Pat. No. 10,840,889, which is a continuation-in-part of application No. 16/052,337, filed on Aug. 1, 2018, now abandoned, which is a continuation-in-part of application No. 14/988,463, filed on Jan. 5, 2016, now Pat. No. 10,062,946.

(51) Int. Cl.
*H03H 17/00* (2006.01)
*H03H 17/08* (2006.01)

(56) References Cited

U.S. PATENT DOCUMENTS

| | | | | |
|---|---|---|---|---|
| 4,121,180 | A | * | 10/1978 | Greenway ............... H03H 7/48 333/112 |
| 4,586,047 | A | | 4/1986 | Inacker et al. |
| 4,859,972 | A | | 8/1989 | Franke et al. |
| 4,937,541 | A | * | 6/1990 | Podell .................... H03H 7/48 333/116 |
| 5,180,998 | A | * | 1/1993 | Willems ................ H03H 11/20 327/237 |
| 6,741,207 | B1 | | 5/2004 | Allison et al. |
| 7,256,721 | B2 | | 8/2007 | Copley |
| 8,248,302 | B2 | * | 8/2012 | Tsai ....................... H01P 1/18 342/372 |
| 10,062,946 | B2 | | 8/2018 | Sharma et al. |
| 10,840,889 | B2 | | 11/2020 | Birkbeck et al. |
| 11,711,068 | B2 | | 7/2023 | Birkbeck et al. |
| 2005/0040874 | A1 | | 2/2005 | Allison et al. |
| 2005/0270122 | A1 | | 12/2005 | Hyman et al. |
| 2010/0327998 | A1 | | 12/2010 | Jansen et al. |
| 2011/0068843 | A1 | | 3/2011 | Kodama |
| 2015/0270821 | A1 | | 9/2015 | Natarajan et al. |
| 2017/0194688 | A1 | | 7/2017 | Sharma et al. |
| 2019/0140622 | A1 | | 5/2019 | Birkbeck et al. |
| 2019/0296718 | A1 | | 9/2019 | Birkbeck et al. |
| 2021/0135656 | A1 | | 5/2021 | Birkbeck et al. |
| 2021/0203374 | A1 | | 7/2021 | Pal et al. |

OTHER PUBLICATIONS

Glenn, Kimberly E., Notice of Allowance received from the USPTO dated Jan. 12, 2018 for U.S. Appl. No. 14/988,463, 12 pgs.

Glenn, Kimberly E., Notice of Allowance received from the USPTO dated May 10, 2018 for U.S. Appl. No. 14/988,463, 12 pgs.

Sharma, et al., Response filed in the USPTO dated Nov. 17, 2017 for U.S. Appl. No. 14/988,463, 11 pgs.

Sharma, et al., Response filed in the USPTO dated Nov. 20, 2017 for U.S. Appl. No. 14/988,463, 11 pgs.

Sharma, et al., Preliminary Amendment filed in the USPTO dated Feb. 9, 2018 for U.S. Appl. No. 14/988,463, 11 pgs.

"A Very Low Loss 1.9-2.1 Ghz RF MEMS Phase Shifter", 2012, 3 pgs.

Vitale, John, "Hybrid Coupler Implemented as a Phase Shifter", Marquette University, e-Publication@Marquette, Master's Thesis, 2009, 88 pgs.

Miyaguchi, et al., "An Ultr-Broad-Band Reflection-Type Phase-Shifter MMIC with Series and Parallel LC Circuits", IEEE Transactions on Microwave Theory and Techniques, vol. 49, No. 12, Dec. 2001, pp. 2446-2452.

Klag, Brigitta, Invitation to Pay Additional Fees and, Where Applicable, Protest Fee received from the EPO dated Feb. 22, 2017 for appln. No. PCT/US2016/061437, 7 pgs.

Flament, et al., "A Combined 4-bit Quadrature Digital to Analog Converter/Mixer for Millimeter-Wave Applications", Electronics, Circuits, and Systems, 2009. ICECS 2009, 16th IEEE International Conference, Dec. 13, 2009, pp. 964-967.

De La Pinta, Luis, International Search Report and Written Opinion received from the EPO dated May 17, 2017 for appln. No. PCT/US2016/061437, 20 pgs.

Peregrine Semiconductor Corporation, Demand and Amendment filed in the EPO dated Nov. 3, 2017 for appln. No. PCT/US2016/061437, 26 pgs.

De La Pinta, Luis, Written Opinion received from the EPO dated Dec. 5, 2017 for appln. No. PCT/US2016/061437, 11 pgs.

Peregrine Semiconductor Corporation, Response to Written Opinion filed in the EPO dated Feb. 2, 2018 for appln. No. PCT/US2016/061437, 22 pgs.

Glenn, Kimberly E., Office Action received from the USPTO dated Nov. 25, 2020 for U.S. Appl. No. 16/052,337, 14 pgs.

Glenn, Kimberly E., Office Action received from the USPTO dated Mar. 2, 2020 for U.S. Appl. No. 16/372,194, 15 pgs.

Glenn, Kimberly E., Notice of Allowance received from the USPTO dated Jul. 13, 2020 for U.S. Appl. No. 16/372,194, 12 pgs.

PSEMI Corporation, Response filed in the USPTO dated Jun. 2, 2020 for U.S. Appl. No. 16/372,194, 8 pgs.

Yang, Tiecheng, English translation of Office Action received from the CNIPA dated Jan. 28, 2021 for appln. No. 201680077759.7, 25 pgs.

Du, et al., English translation of Office Action received from the CNIPA dated Feb. 18, 2023 for appln. No. 201910548690.7, 9 pgs.

Liu, et al., "A High-Precision Broadband Phase and Amplitude Control Multi-Function MMIC" Research & Progress of Solid State Electronics, vol. 35, No. 6, Dec. 25, 2015, 8 pgs.

Glenn, Kimberly E., Office Action received from the USPTO dated Jan. 20, 2022 for U.S. Appl. No. 17/094,654, 19 pgs.

Glenn, Kimberly E., Office Action received from the USPTO dated Aug. 4, 2022 for U.S. Appl. No. 17/094,654, 7 pgs.

Glenn, Kimberly E., Notice of Allowance received from the USPTO dated Mar. 8, 2023 for U.S. Appl. No. 17/094,654, 9 pgs.

\* cited by examiner

LOW LOSS REFLECTIVE PASSIVE PHASE SHIFTER USING TIME DELAY ELEMENT WITH DOUBLE RESOLUTION

CROSS-REFERENCE TO RELATED APPLICATIONS—CLAIM OF PRIORITY

The present application is a continuation of, and claims priority to, co-pending and commonly assigned U.S. patent application Ser. No. 17/094,654, filed Nov. 10, 2020, entitled "Low Loss Reflective Passive Phase Shifter using Time Delay Element with Double Resolution", to issue on Jul. 25, 2023 as U.S. Pat. No. 11,711,068, the entire contents of which is incorporated herein by reference, which is continuation of, and claims priority to, commonly assigned U.S. patent application Ser. No. 16/372,194, filed Apr. 1, 2019, entitled "Low Loss Reflective Passive Phase Shifter using Time Delay Element with Double Resolution", now U.S. Pat. No. 10,840,889, issued Nov. 17, 2020, the entire contents of which is incorporated herein by reference, which is a continuation-in-part of, and claims priority to, commonly assigned U.S. patent application Ser. No. 16/052,337, filed Aug. 1, 2018, entitled "Low Loss Reflective Passive Phase Shifter using Time Delay Element", now abandoned, the entire contents of which is incorporated herein by reference, which application is a continuation-in-part of, and claims priority to, commonly assigned U.S. patent application Ser. No. 14/988,463, filed Jan. 5, 2016, entitled "Reflection-Based RF Phase Shifter", now U.S. Pat. No. 10,062,946 issued Aug. 28, 2018, the entire contents of which is incorporated herein by reference.

BACKGROUND

(1) Technical Field

Various embodiments described herein relate to phase shifters and more particularly to passive phase shifters.

(2) Background

Phase shifters are devices that are used to change or optimize the transmission phase angle of a signal. Phase shifters are useful in frequency translators, phased arrays (including phased array antenna structures, such as are used in beamforming networks, distributed antenna systems and phased-array radar), solid state power amplifiers and for measuring residual phase noise, among other uses. Currently, phased arrays are starting to find use in some of the newer WiFi routers. Another consumer market that is developing for phase arrays is satellite television for vehicles such as RVs. In addition, phase shifters are commonly used in products, such as military and commercial radar systems.

There are several characteristics by which phase shifters are characterized. A first characteristic is insertion loss (or gain). Ideally, passive phase shifters provide low insertion loss in all phase states. A second characteristic is linearity over phase (i.e., whether the amplitude at the output of the phase shifter is equal for all phase states). A third characteristic is whether the phase shifter is reciprocal. That is, whether the phase shifter works effectively on signals passing through in either direction. A fourth characteristic is the phase response of the phase shifter over frequency and its available control range. Other characteristics of phase shifters that are typically considered include the bandwidth over which the phase shifter can operate and the amount of power that the phase shifter can handle.

Many phase shifters are digital phase shifters. Digital phase shifters are digitally controlled. Accordingly, control over the amount of shift applied to the transmission phase of a signal applied to the input of the digital phase shifter is provided by setting a value of a digital control word. The digital control word is applied to control lines of the digital phase shifter. Accordingly, digital phase shifters provide one from among a discrete set of phase states. The particular transmission phase state is determined by the state of "phase control bits" applied to the phase control lines. In contrast, the transmission phase of the output of an analog phase shifter is typically determined by the voltage of a phase control signal applied to a phase control input of the analog phase shifter.

Digital phase shifters are popular because they have greater immunity to noise on their control lines. In a digital phase shifter that has a range of 360 degrees, the highest order bit causes a phase shift of 180 degrees when it is in a first state (e.g., a logic "one") and a phase shift of zero degrees when in a second state (e.g., a logic "zero"). The next highest order bit causes a phase shift of 90 degrees when it is in a first state and zero degrees in a second, then 45 degrees, etc., as the range of the phase shifter (e.g., 360 degrees in this case) is divided into smaller and smaller binary steps. The least significant bit (LSB) of a three-bit digital phase shifter would alter the phase of the output signal by 45 degrees. In contrast, the LSB of a six-bit digital phase shifter would alter the phase of the output by approximately 5.6 degrees.

In addition to being either analog or digital, phase shifters can be either passive or active. Passive phase shifters have no active components. One common type of passive phase shifter is called a reflection phase shifter. Reflection phase shifters can be implemented in at least three ways. One way to implement a reflection phase shifter is to use a circulator. Such reflective phase shifters require only one termination.

Passive phase shifters have the advantage of typically being more linear and having higher power handling capability. Furthermore, passive phase shifters do not require DC power and are typically reciprocal (i.e., bi-directional). Still further, passive phase shifters are generally more stable over process, voltage, and temperature (PVT). That is, the characteristics of the phase shifter remain relatively constant when produced in relatively high volume and when operated at varying voltage and temperature.

In contrast, active phase shifters typically can provide insertion gain, rather than insertion loss. In addition, active phase shifters tend to require less die area on an integrated circuit chip. However, these advantages come at the expense of being uni-directional, requiring DC power, being less linear, having lower power handling capability and being less stable in high volume production.

FIG. 1 is an illustration of a reflection phase shifter 100 using a circulator 102. The input signal is applied to an input port 104 of the circulator 102. A second port 106 of the circulator (the next port in the direction of the signal flow) is coupled to a transmission line 108. The output of the phase shifter 100 is output from a third port 110 of the circulator 102. The transmission line 108 is terminated to ground 114. A switch 112 is coupled to the line 108. When closed, the switch 112 reduces the distance between the second port 106 and ground by a distance L. Reducing the distance between the second port 106 and ground will shift the phase of the output signal that exits the circulator at the third port 110. The phase of the output signal will shift with respect to the signal applied to the input port 104 as follows:

$\Delta\phi = 2\pi 2L/\lambda$ where $\Delta\phi$ is the phase difference that occurs with the switch 112 closed, with respect to the phase with the switch 112 open, and L is the difference in the length of the distance between the second port 106 and ground with the switch 112 closed versus with the switch 112 open.

FIG. 2 is an illustration of another reflective phase shifter 200. The phase shifter 200 comprises a hybrid coupler 202. In one particular instance, the hybrid coupler 202 is fabricated using substrate integrated waveguide (SIW) technology. The phase shifter employs a standard reflection type phase shifter architecture, consisting of a hybrid coupler 202 having an input port 204, direct port 206, coupled port 208, and isolated port 210. The RF input to the phase shifter 200 is applied to the input port 204 of the hybrid coupler 202. The direct port 206 and the coupled port 208 are connected to two identical variable reflective loads 212. The output of the phase shifter 200 is provided through the isolated port 210.

In some such phase shifters, varactor diodes are coupled to the hybrid coupler through transverse slots etched on the broad wall of the SIW. Each of the diodes is controlled by the same biasing network in an attempt to attain continuous electronic control of the phase shift. The equivalent circuit of the transverse slot that is etched on the broad wall of the SIW is a parallel RLC network whose resonating frequency depends on the length of the slot. In addition, the quality factor of the parallel RLC network depends on its width and offset of the slot. These parameters are relative to the dimensions of the waveguide and to the substrate employed. A lumped capacitance Cd is inserted between the broad edges of the transverse slot. The equivalent circuit is given by the parallel connection between the unloaded slot and a capacitance Cd. By modulating the value of this capacitance Cd with a varactor, a variable impedance, series connected to the waveguide, is realized. When Cd is increased the resonant frequency $\omega L$ of the loaded slot moves toward lower values and the phase of the reflection coefficient is varied.

While such a phase shifter might be appropriate for some applications, there remains a need for a simple and effective digital phase shifter that can provide continuous phase shifts in steps over a relatively broad range of phase shifts.

SUMMARY OF THE INVENTION

A phase shifter for altering the phase of a radio frequency (RF) signal is disclosed herein. Several embodiments of the phase shifter are disclosed, including phase shifters that use a Lange coupler having reflective ports that are coupled to artificial transmission lines (ATLs). In other embodiments, the coupler is a hybrid transformer-based coupler. The ATLs provide a reflection transmission path, the length of which can be determined by digital control lines. The ATLs each have a central trace that has a predetermined length selected to provide the desired maximum phase shift. In some embodiments, the distal end of the central trace is shorted to ground. Transistors placed along the length of the central trace provide independent paths to ground that serve to shorten the electrical length of the ATL. Accordingly, by selectively turning the transistors on/off, the electrical length of the ATL can be selected and thus select the amount of phase delay introduced by the phase shifter. In accordance with some embodiments, the coupler is a hybrid used in place of the Lange coupler.

In some embodiments, the transistors are tapered in size along the length of the ATLs to provide a more consistent insertion loss as various phase shifts are selected. In some such embodiments, the distance between a ground trace and the central trace is also tapered along the length of the ATL to compensate for differences in the capacitance of the tapered transistors. In addition, some embodiments have an integrated digital switched attenuator that allows selective attenuation of the signal, as well as selective phase shifting.

In some embodiments, transistors are placed on each side of the central trace and aligned in pairs. Each transistor of a pair is turned on and off together. In other embodiments, the transistors on each side of the central trace are offset from one another with respect to their distance to the reflective port to which the ATL is coupled. Accordingly, the resolution of the phase shifter can be increased by providing twice the number of selectable electrical lengths along the ATL.

The details of one or more embodiments of the disclosed apparatus are set forth in the accompanying drawings and the description below. Other features, objects, and advantages of the disclosed apparatus will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 3:
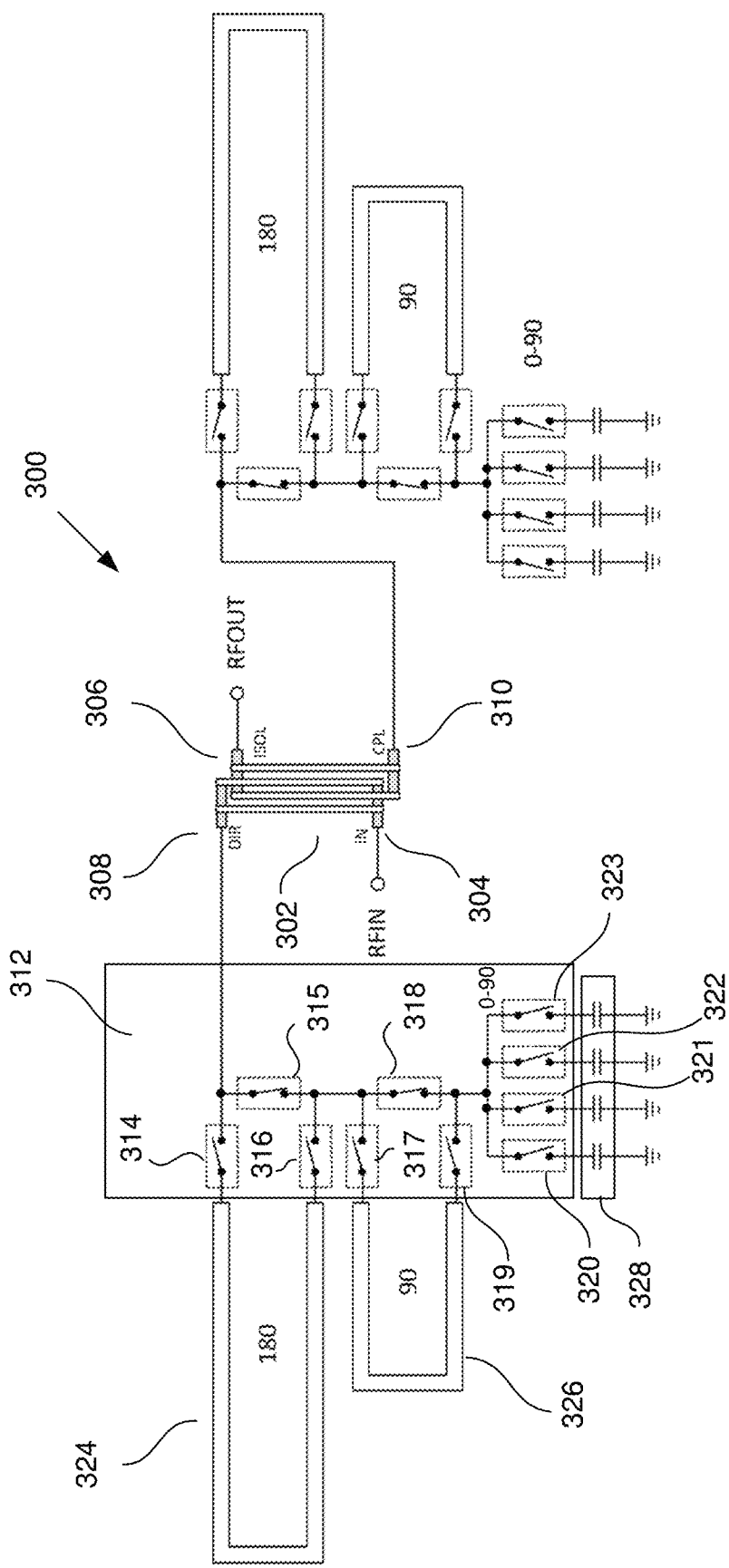
FIG. 3 is an illustration of a reflection phase shifter using a Lange coupler.

FIG. 3 is an illustration of a reflection phase shifter 300 using a Lange coupler. The Lange coupler 302 has four ports: an input port 304, an isolation (output) port 306, a direct port 308 and a coupled port 310. The direct port 308 and the coupled port 310 are each terminated. However, the termination is provided through a network 312 of switches that determine the nature of the path between each port 308, 310 and ground.

The paths to ground for both the direct port 308 and the coupled port 310 are essentially identical. Accordingly, for the sake of simplicity, only the path from the direct port 308 is described in detail below. However, it should be understood that the description of the path from the direct port 308 to ground applies equally to the path from the coupled port 310 to ground.

The direct port 308 is coupled to a first terminal of a "180°/in switch" 314 and a "180° bypass switch" 315 within a switch network 312. The second terminal of the 180°/in switch 314 is coupled to the first end of a 180° transmission line 324. The second end of the transmission line 324 is coupled to the first terminal of a 180°/out switch 316. The second terminal of the 180° bypass switch 315 and the second terminal of the 180°/out switch 316 are coupled together. Accordingly, by closing the 180° bypass switch, the 180° transmission line 324 is bypassed. The 180°/in and 180°/out switches 314, 316 are both closed when the 180° bypass switch is open to provide a path from the direct port 308 through the 180° transmission line 324. Likewise, when the 180° bypass switch 315 is closed, the 180°/in and 180°/out switches are both open to remove the 180° transmission line 324 from the path.

Figure 1:
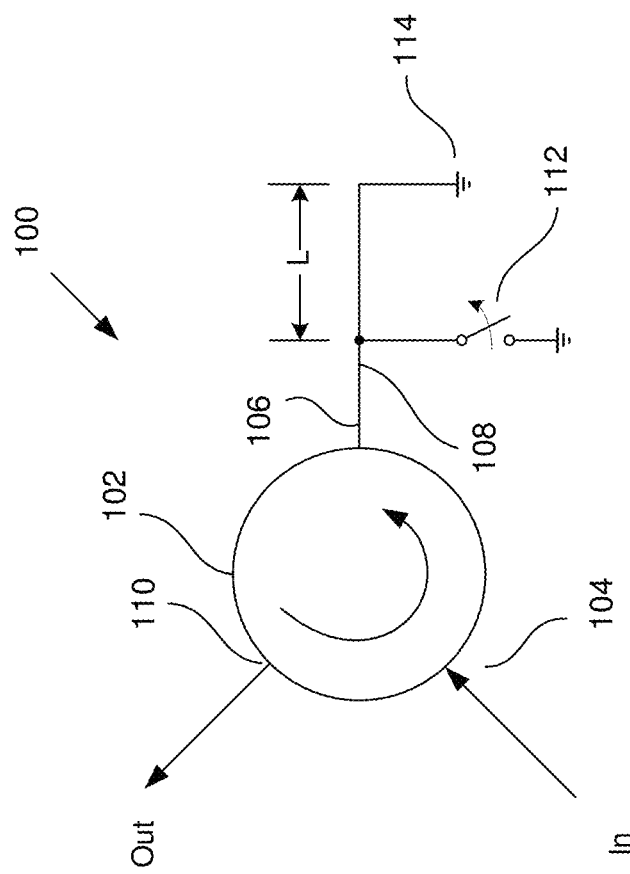
FIG. 1 is an illustration of a prior art reflection phase shifter using a circulator.
Figure 2:
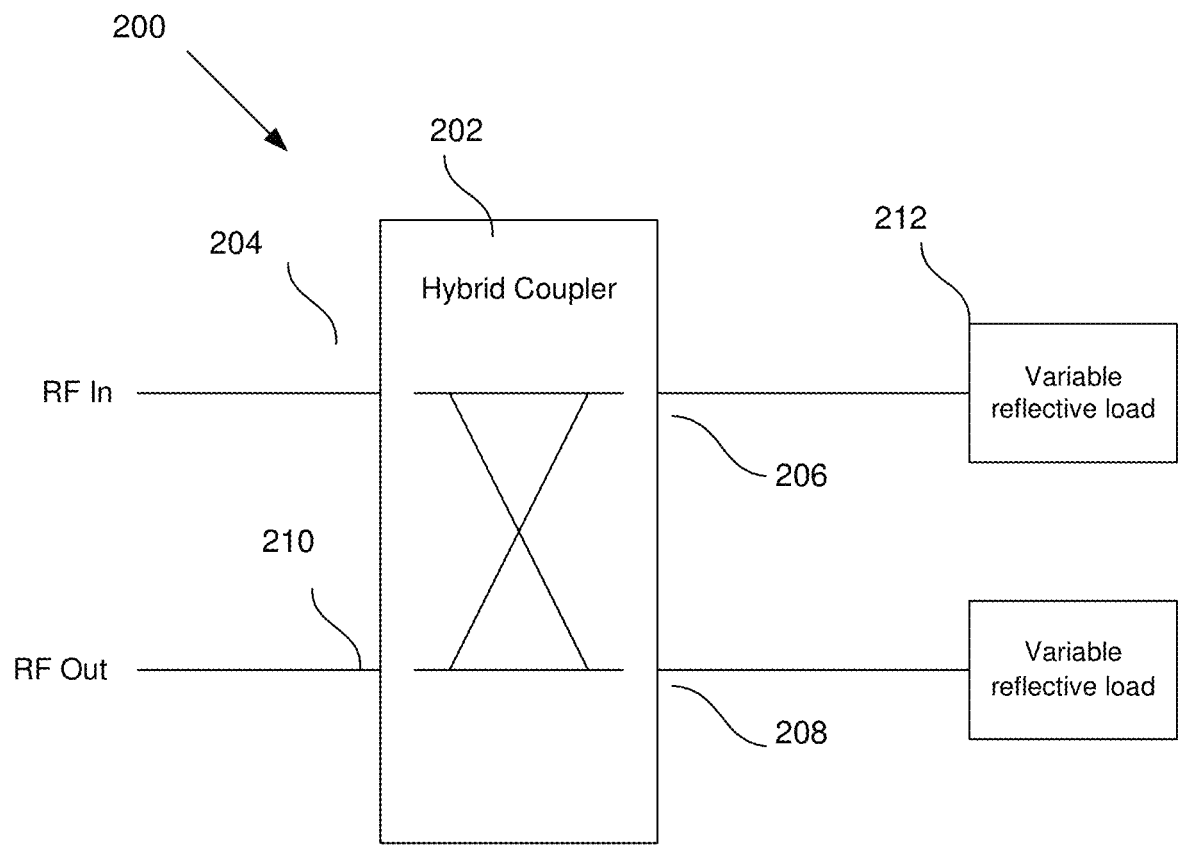
FIG. 2 is an illustration of another prior art reflective phase shifter which comprises a hybrid coupler.

In similar fashion to the 180° transmission line 324, a 90° transmission line 326 is coupled between a 90°/in switch 317 and a 90°/out switch 319. A 90° bypass switch 318 is connected between the 90°/in and 90°/out switches 317, 319 to allow the 90° transmission line 326 to be bypassed. A set of capacitance switches 320-323 are each coupled at one terminal to a corresponding one from among a set of capacitors 328. Each of the capacitors 328 has a capacitance that is selected to provide a stepped phase shift when the associated capacitor switch 320-323 is closed. Accordingly, by selecting combinations of switches 314-323 from among the switch network 312, the phase shift can be selected to be any one of sixty-four discrete values between zero and typically just under 360°. With all of the switches closed except for the two bypass switches 315, 318, the maximum phase shift is selected. With all of the switches open, the output RF signal has a phase shift of zero degrees with respect to the RF input signal. In some embodiments, the phase that is presented with all switches open is a reference phase angle of "zero" degrees, with respect to which all other phase states are measured. This is in contrast to the case in which a zero degree phase shift is taken with respect to the input signal. A similar termination path could be provided for the path from the third port 110 of the circulator 102 of the phase shifter 100 shown in FIG. 1 or to provide the variable termination for the hybrid coupler 202 of FIG. 2.

However, the large number of switches through which the RF signal must pass in any of the phase shifts selected substantially increases the insertion loss of the phase shifter, regardless of which particular architecture is selected. In addition, unwanted parasitic elements, particularly off-state capacitance associated with the switches, makes it challenging to design this termination network to operate over a typical operational bandwidth.

Figure 4:
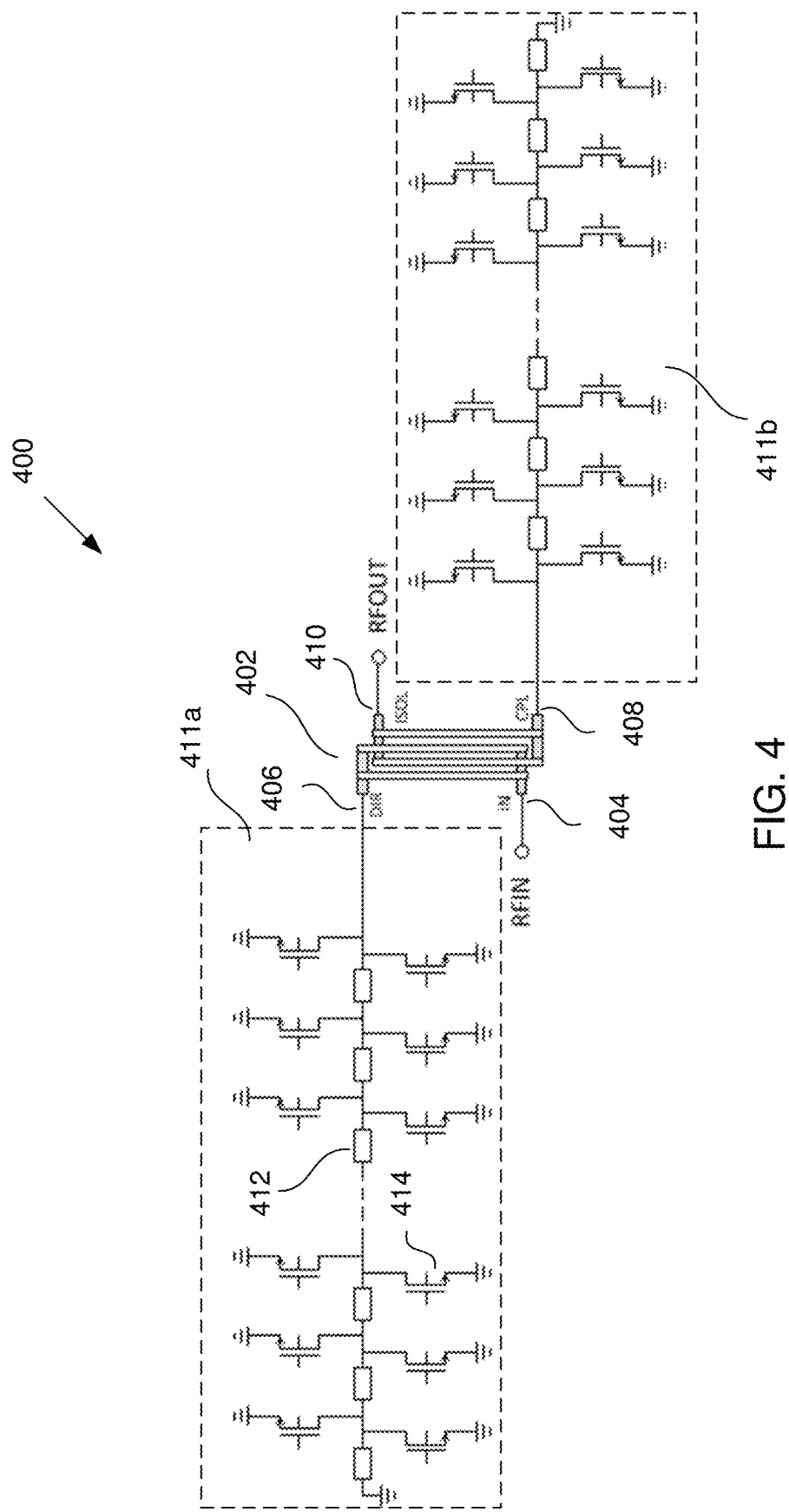
FIG. 4 is an illustration of a digital reflective phase shifter using a Lange coupler and having relatively low insertion loss.

FIG. 4 is an illustration of a digital reflective phase shifter 400 using a Lange coupler 402 and having relatively low insertion loss. The phase shifter 400 provides the ability to select a phase shift from a broad range of phase shifts with relatively high resolution (i.e., relatively small step size between selectable phase shifts).

The Lange coupler 402 has four ports: (1) an RF input port 404, (2) a direct port 406, (3) a coupled port 408, and (4) an isolation port 410. The direct port 406 and the coupled port 408 are each coupled to one of two artificial transmission lines (ATLs) 411a, 411b built from inductive tracks 412 and switches (e.g., FETs) 414. In the case in which the switches are FETs, the drain-to-source off-capacitance ($C_{off}$) of each FET 414 (when not conducting) contributes to the overall characteristic impedance of the ATL 411. Accordingly, the characteristic impedance of the ATL is a function of the size of the FETs 414. When at least one of the FETs 414 is conducting, the FET 414 that is closest to the Lange coupler port 406, 408 from among the FETs 414 that are conducting, determines the electrical length of the ATL 411. Changing the electrical length of the ATL 411 alters the amount of time it takes the signal to propagate along the ATL 411 to ground and then reflect back to the port 406, 408 of the Lange coupler 402. Accordingly, the phase of the reflected signal with respect to the signal launched by the port 406, 408 changes as a function of which FETs 414 are conducting (i.e., which FET 414 provides a path to ground). It should be noted that the state of FETs 414 that are further from the coupler 402 than the closest conducting FET 414, have no significant effect on the phase of the signal that is output by the phase shifter 400. However, in some embodiments, such FETs 414 may also be turned on (i.e., biased to conduct) in order to minimize secondary reflections. Secondary reflections are caused by stray currents that leak past the conducting FET and get reflected back from the ground at the end of the path.

Figure 5A:
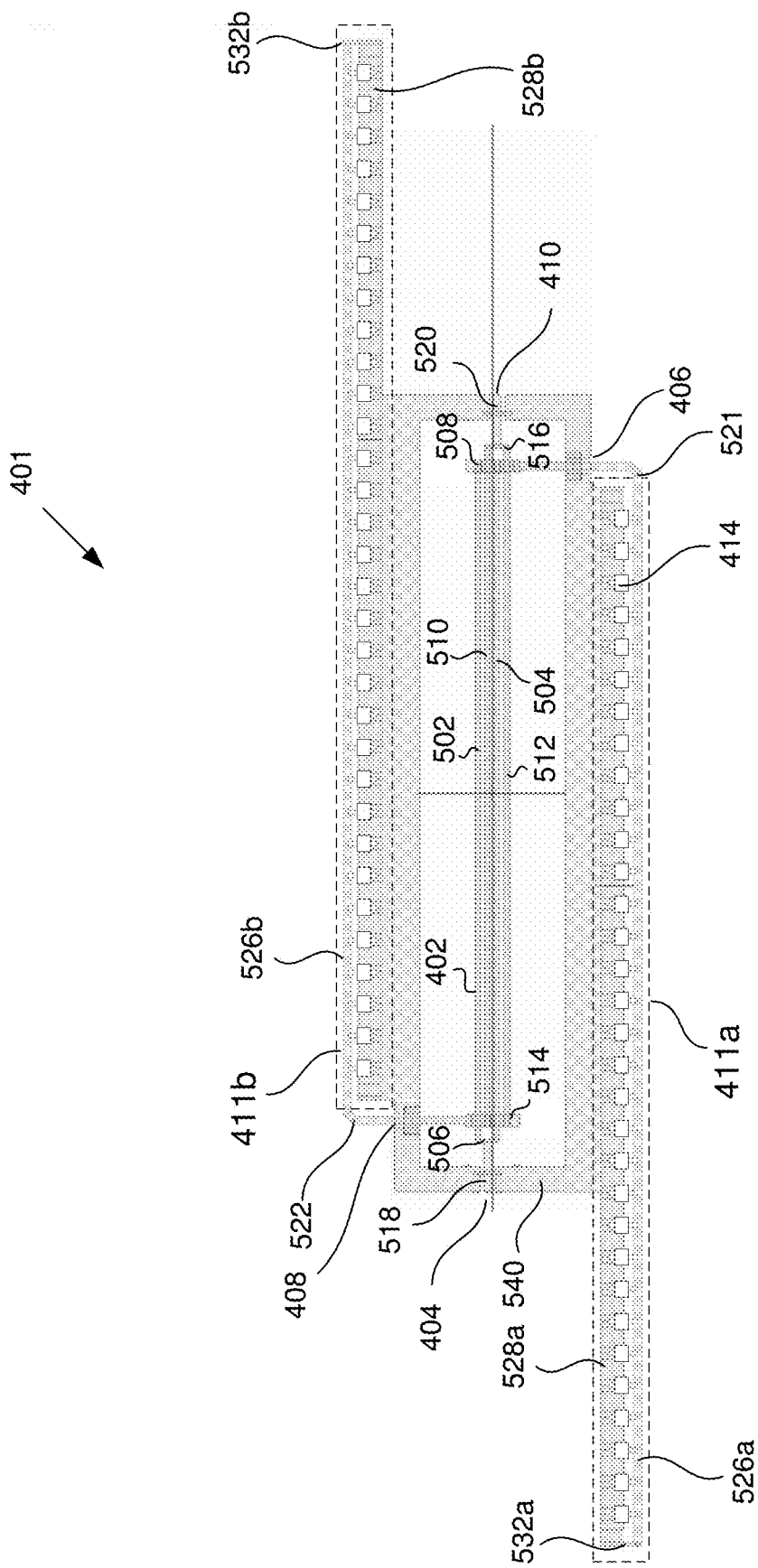
FIG. 5A is an illustration of a simplified layout of a Lange coupler and associated artificial transmission lines (ATLs).

FIG. 5A is an illustration of a simplified layout of a phase shifter 401 using a Lange coupler 402 and associated ATLs 411a, 411b. The Lange coupler 402 comprises a first two conductive traces 502, 504 coupled at both a proximal end 506 and a distal end 508 of the coupler. The two traces are interlaced with a second two traces 510, 512. A second two traces 510, 512 are also coupled at both the proximal end 514 and the distal end 516 of the coupler 402. Access to the RF input port 404 is provided by a trace 518 coupled to the proximal end 506 of the traces 502, 504. The RF output of the coupler 402 is taken at the isolation port 410. Access to an isolation port 410 of the Lange coupler 402 is provided by a trace 520 at the distal end 516 of the traces 510, 512. Access to the coupled port 408 is provided by a trace 522 coupled to the proximal end 514 of the traces 510, 512. Access to the direct port 406 is provided by a trace 521 coupled to the distal end 508 of the traces 502, 504.

Each of the two ATLs 411a, 411b comprises a central trace 526a, 526b coupled to one of the two traces 521, 522 that provide access to the two reflective ports 406, 408, respectively. (It should be noted that when several features have the same numeric value, but different alphabetic values, the numeric value alone is used to refer to all such features sharing the same numeric value. For example, central trace 526 refers to both central trace 526a and central trace 526b). For the first ATL 411a there is a section of ground 528a provided on one longitudinal side of the central trace 526a. A second section of ground 528b is provided on one longitudinal side of the second central trace 526b. Each section of ground 528a, 528b is connected to a ring of ground conductor 540 that encircles the coupler 402.

In the layout shown in FIG. 5A, FETs 414 are shown simply as blocks placed at intervals along one side of each of the ATLs 411. In some embodiments, each FET 414 has a e.g.t terminal (e.g., drain), a second terminal, (e.g., source), and a control terminal (e.g., gate). For the sake of simplicity, the details of the layout of the FETs 414 are not shown in FIG. 5A. However, those skilled in the art will know how to layout the FETs 414 such that the FETs 414 provide a path between the central trace 526 and the ground section 528 when the FET 414 is turned on to provide a low resistance between the first terminal of the FET 414 and the second terminal of the FET 414. For each FET 414 of each ATL 411, the first terminal is coupled to the central trace 526 at intervals along the central trace 526 and the second terminal is coupled to ground at intervals along the ground section 528. The control terminal is coupled to a source of a control signal that controls whether the FET 414 is on or off (see FIG. 6).

Figure 5B:
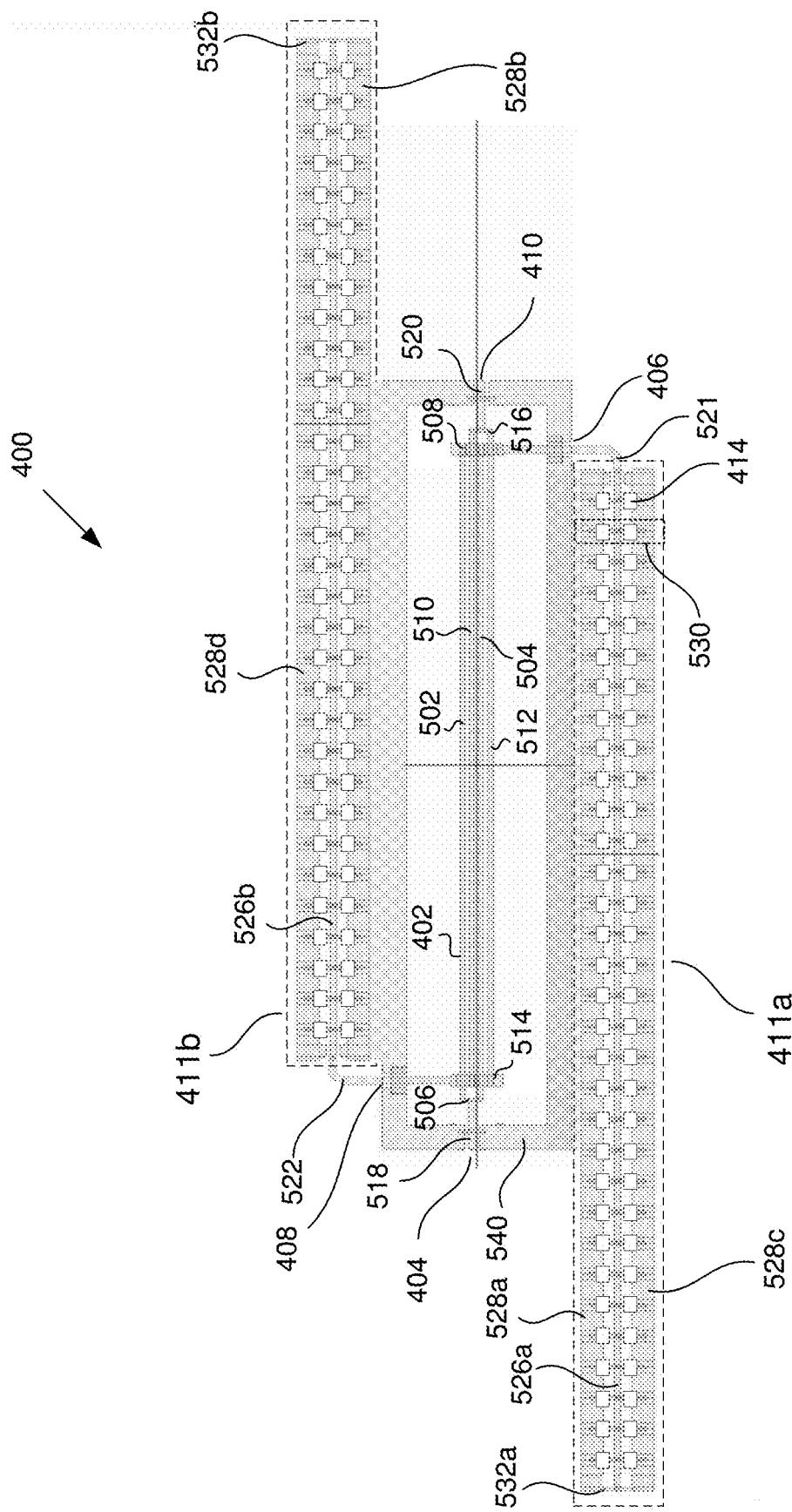
FIG. 5B is an illustration of an alternative embodiment of the phase shifter having FETs on two sides of each central trace.

FIG. 5B is an illustration of a simplified layout of an alternative embodiment of a phase shifter 400 using a Lange coupler 402 and associated ATLs 411a, 411b and having FETs 414 coupled on both sides of the central trace 526.

In the layout shown in FIG. 5B, FETs 414 are shown as blocks placed in pairs 530 along each side of each of the ATLs 411. For the first ATL 411a there are two sections of ground 528a, 528c provided; one on each side of the central trace 526a. Similarly, the second ATL 411b has two sections of ground 528b, 528d; one on each side of the central trace 526b. The width and thickness of the central trace 526 and the spacing between each section of ground 528 and the central trace 526, together with the off-state capacitance of the FETs 414 determine the capacitive reactance per unit length of the ATL 411. The width and thickness of the trace 526 also determines the inductive reactance per unit length of the ATL 411. The phase shifter 400 operates essentially the same as the phase shifter 401. However, providing a first subset of FETs 414 on one side of the central trace 526 and a second subset of FETs 414 on the other side of the central trace 526, wherein each FET 414 of the first subset is aligned with a FET 414 of the second subset to form a pair 530, reduces the resistance of the path to ground when the both FETs 414 of the pair 530 are on. Accordingly, in one embodiment of the disclosed apparatus, the distance along the central trace 526 is the same between the port 406, 408 and each of the two FETs 414 that comprise a pair 530.

In such embodiments, each of the two FETs 414 of a pair 530 is turned on and off together. In some embodiments, all FETs 414 in both ATLs 411a, 411b that are the same distance from a reflective port 406, 408 are turned on and off together. Control lines (not shown in FIG. 5A and FIG. 5B) are coupled to the gate of each FET 414. Those skilled in the art will understand how to couple such control lines to the gates of the FETs 414, though neither the gates of the FETs 414, nor the control lines, are shown for the sake of simplicity. Such control lines provide a bias voltage to the gate of each FET 414 to allow the FETs 414 to be selectively biased to either conduct current to ground 504 (i.e., turn the FET on) or alternatively, to provide a relatively high impedance to ground (i.e., turn the FET off).

In some embodiments in which each FET 414 of a pair 530 is equally distant from the reflective port 406, 408, each FET 414 of a pair 530 is turned on at the same time as the other FET of the same pair 530. In some embodiments, for each ATL 411 there are thirty-two such pairs 530 evenly spaced along the length of the ATL 411. At the distal end 532 of the ATL 411, the central trace 526 is coupled directly to ground 528. Accordingly, with all of the FETs 414 turned off (i.e., not conducting), the electrical length of the ATL 411 is the distance from the reflective port 406, 408 to ground at the distal end 532 of the ATL 411. However, when one or more of the pairs 530 are turned on, the electrical length of the ATL 411 is shortened to the distance between the port 406, 408 and the ground connection through that pair 530 that is both closest to the coupler port and that is on. In some embodiments, when one pair 530 is turned on, all pairs 530 between that pair 530 and the distal end 532 of the ATL 411 are also turned on.

Providing the FETs 414 in pairs 530 provides a relatively low impedance to ground. That is, the $R_{ON}$ (resistance when the FET 414 is biased on) of the pair will be half that of each FET 414 alone. However, as will be seen in other embodiments disclosed below, the FETs 414 need not be operated in pairs when a higher resistance, $R_{ON}$ can be tolerated.

Figure 6:
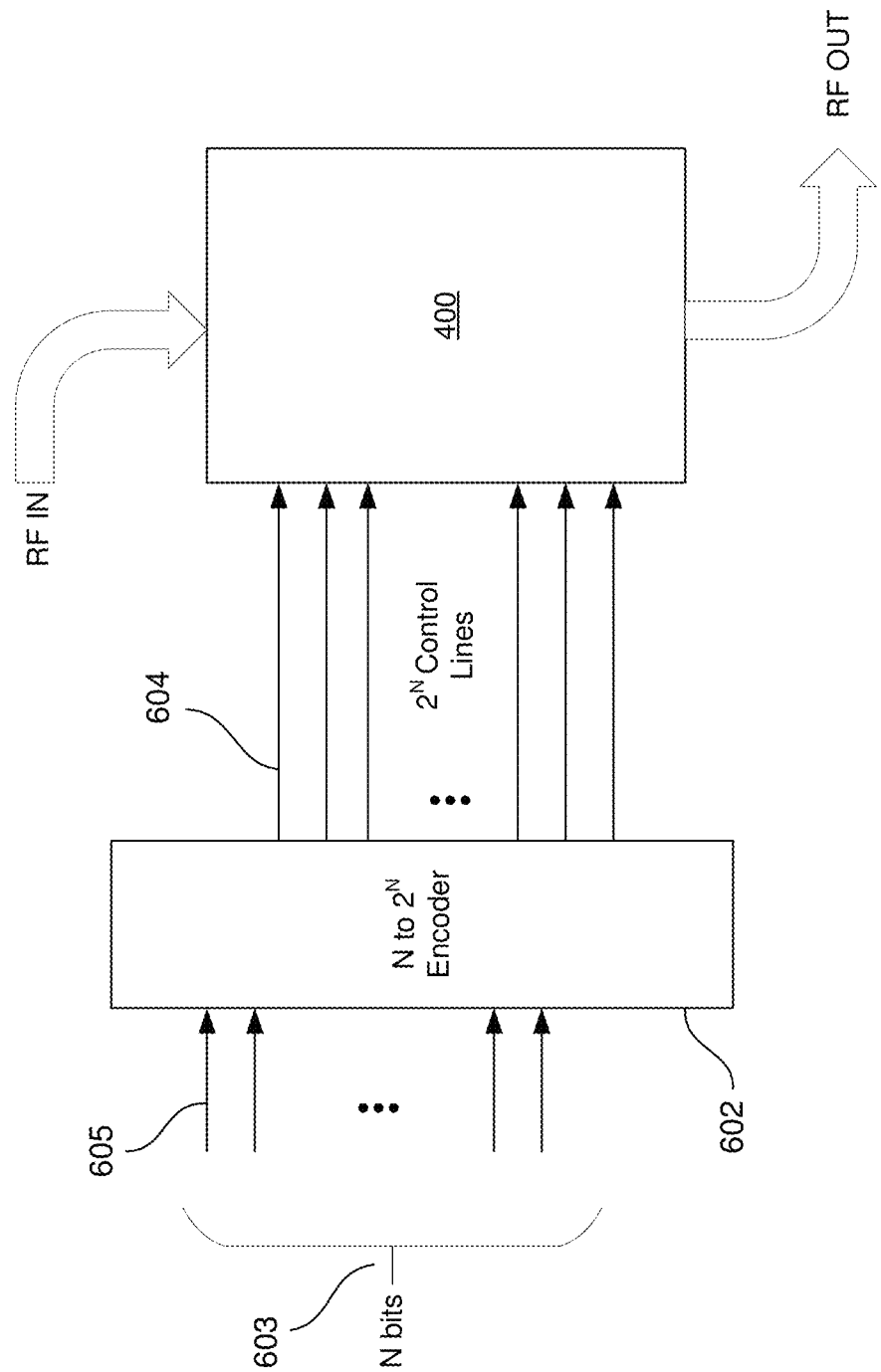
FIG. 6 is a simplified schematic of an N to $2^N$ control line encoder coupled to the phase shifter.

FIG. 6 is a simplified schematic of an N to $2^N$ control line encoder 602 coupled to the phase shifter 400. The encoder 602 receives an N-bit control word 603 that is applied to N input control lines 605. The encoder 602 provides $2^N$ output control lines 604. In the embodiment shown in FIG. 5B, each output control line 604 is coupled to the gate of four FETs 414, grouped in two pairs 530 within the phase shifter 400.

Figure 7:
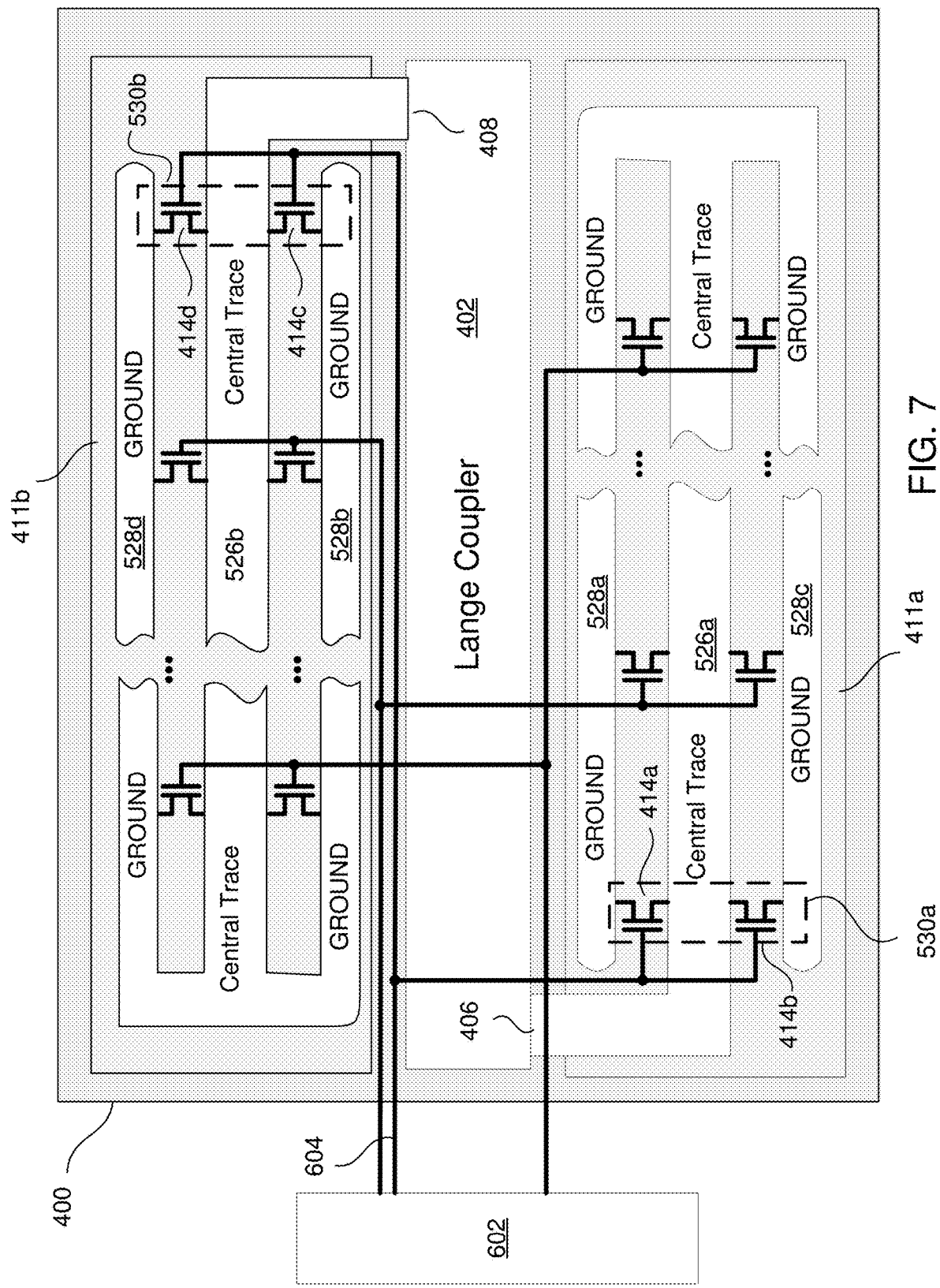
FIG. 7 is a simplified schematic showing the connections of some of the FETs of an ATL.

FIG. 7 is a simplified schematic showing the connections of some of the FETs 414. The first FET 414a of a first pair 530a is coupled between the central trace 526a and the section of ground 528a. A first terminal (e.g., the drain) of each FET is coupled to the central trace 526. A second terminal (e.g., the source) is coupled to the ground section 528). A control terminal (e.g., the gate) is coupled to the encoder 602. The second FET 414b of the first pair 530a is coupled between the central trace 526a and the section of ground 528c. The first FET 414c of the second pair 530b is coupled between the central trace 526b and the section of ground 528b at a distance from the coupled port 408 that is equal to the distance of the first FET 414a of the first pair 530a from the reflective port 406. The second FET 414d of the second pair 530b is coupled between the central trace 526b and the section of ground 528d. Since the gates of all four of these FETs 414a, 414b, 414c, 414d are coupled to the same output control line 604, each of the four FETs 414 will turn on and off together. Accordingly, the electrical length of each of the two ATLs 411 will be the same. In the digital reflective phase shifter 400 of FIG. 5B, there are 32 pairs 530 placed alone each central trace 526 (three of which are shown in FIG. 7). Accordingly, there are a total of 5 inputs (i.e., N=5) to and $2^N=2^5=32$ unique output control lines 604 output from the encoder 602. This results in 32 unique electrical lengths for the ATLs 411. Accordingly, it is possible to apply 32 unique phase shifts to the output signal at the isolation port 410 with respect to the input signal applied to the input port 404. It should be noted that the ground sections 528 shown in FIG. 7 connect to a larger ground circuit through connections that are not shown in FIG. 7.

Figure 8:
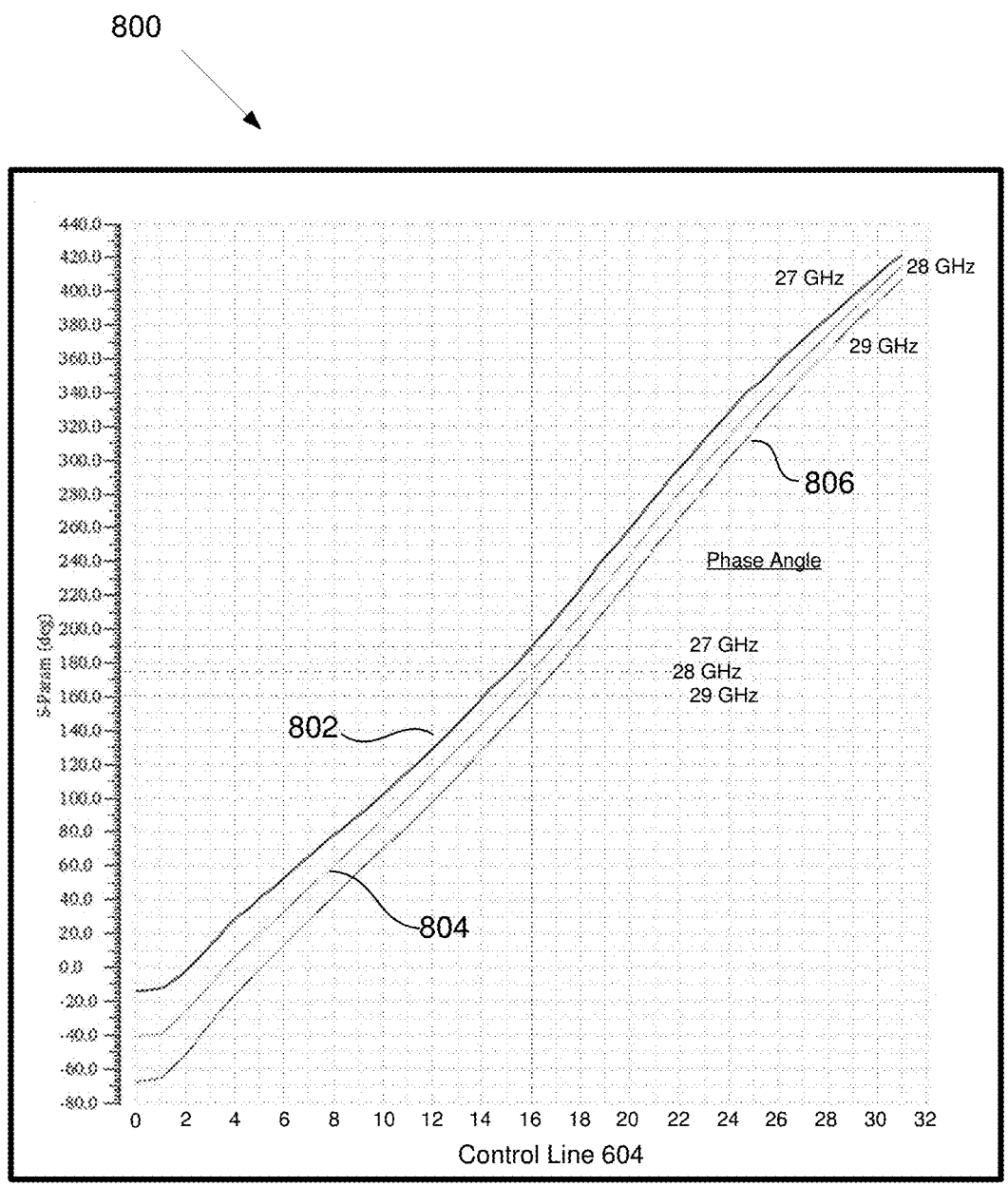
FIG. 8 is a graph of the phase shift applied by the phase shifter at each of three different frequencies as each of the output control lines is activated.

FIG. 8 is a graph 800 of the phase shift applied by the phase shifter 400 at each of three different frequencies (27 GHz, 28 GHz and 29 GHz) as each of the output control lines 604 is activated for a particular implementation. The reference number of the control line 604 that is active is provided along the X-axis. The Y-axis indicates the relative amount of phase shift imposed on the signal output from the phase shifter 400. A first curve 802 is a plot of the phase shift at 27 GHz. A second curve 804 is a plot of the phase shift at 28 GHz. A third curve 806 is a plot of the phase shift at 29 GHz. The graph 800 shows the plot for an embodiment in which there are 32 control lines. Accordingly, when the $16^{th}$ output control line 604 is activated, the amount of phase shift applied to the output signal will be approximately 190° with respect to an input signal at 27 GHz. The amount of phase shift applied to the output signal will be approximately 175° with respect to an input signal at 28 GHz. The amount of phase shift applied to the output signal will be approximately 160° with respect to an input signal at 29 GHz. Differences in the phase shift at the various frequencies are due to the fact that the phase shift is a result of changing the electrical distance from the two reflective ports to the end of the ATL 411 (i.e., to ground) and back. However, the electrical distance is measured with respect to the wavelength of the signal. Therefore, for any particular change in the physical length of the ATL 411, the amount of change in the electrical length for each frequency will be different, thus resulting in a different amount of change in the phase of the signal. As noted above, in some embodiments, when a particular control line is activated (i.e., the FETs controlled by that control line are turned on), all of the control lines between the FETs controlled by that output control line 604 and the distal end of the ATL 411 will also be active. However, in alternative embodiments, this is not necessarily the case. It should be noted that the amount of phase shift indicated in the graph 800 extends over a range of approximately 470°.

Figure 9:
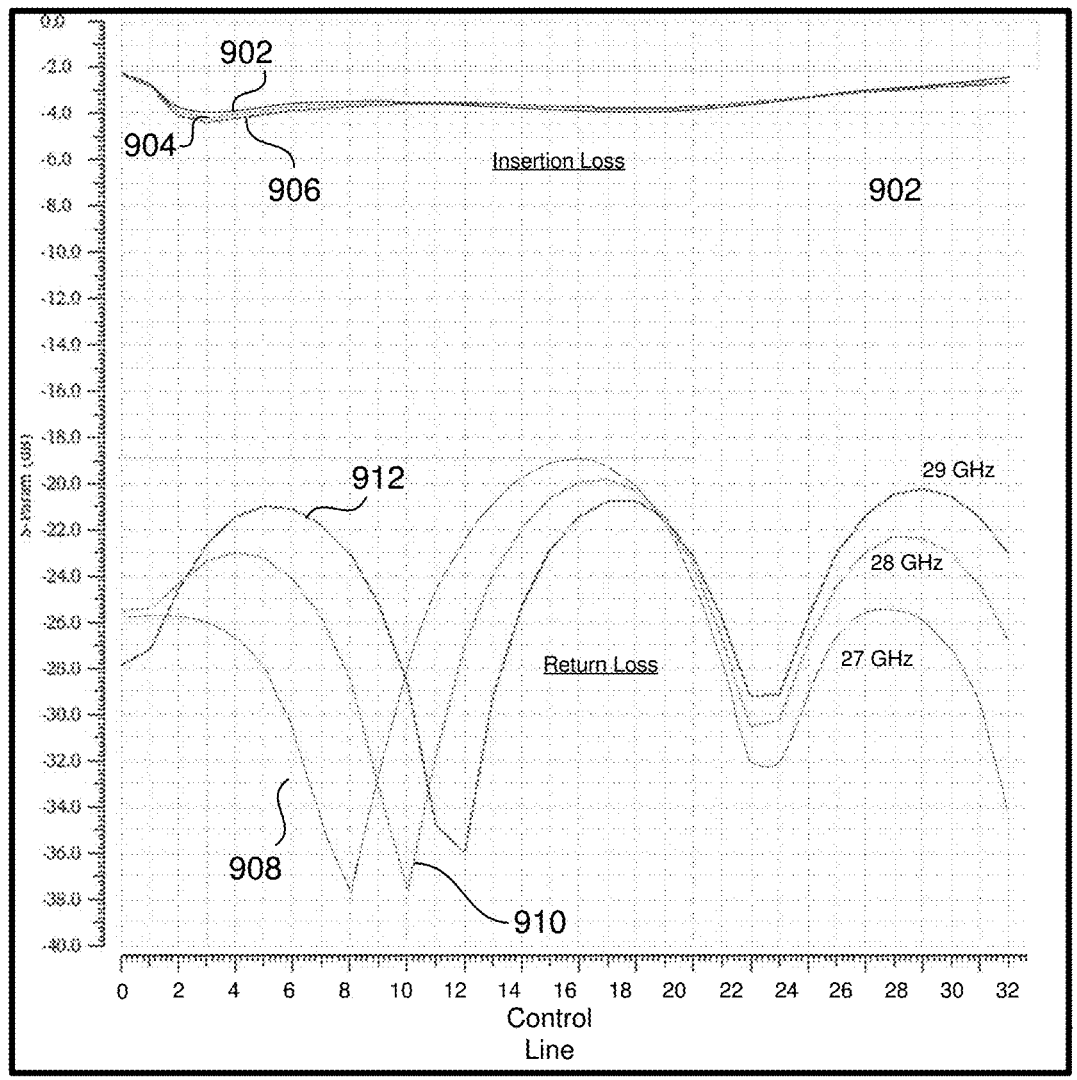
FIG. 9 is a graph of the insertion loss and the return loss of the phase shifter for each of the possible phase shifts, including when none of the control lines are active.

FIG. 9 is a graph of the insertion loss (S11 parameter) and the return loss (S21 parameter) of the phase shifter 400 for each of the 33 possible phase shifts, including when none of the 32 control lines are active (i.e., all FETs 414 are turned off). Three curves are plotted for the insertion loss. The first curve 902 shows the insertion loss at 27 GHz versus phase shift (in terms of which output control lines 604 are active). The second curve 904 shows the insertion loss at 28 GHz versus phase shift. The third curve 906 shows the insertion loss at 29 GHz versus phase shift. The phase shift is plotted in terms of which output control line 604 is active. The output control line 604 controlling the phase shift is plotted along the X-axis for an embodiment in which there are 32 control lines. The Y-axis indicates the amount of insertion loss in decibels.

For all three frequencies, the insertion loss is shown to remain within a range of approximately −2.2 dB (in all three frequencies with none of the output control lines 604 active) to approximately −4.2 dB (at 29 GHz when the third output control line 604 is activated).

In addition, three curves are plotted that show the return loss at three frequencies of interest. The Y-axis shows the return loss. The first curve 908 shows the return loss versus phase shift for signals at 27 GHz (as indicated by the state of the control signals indicated on the X-axis). The second curve 910 shows the return loss versus phase shift for signals at 28 GHz. The third curve 912 shows the return loss versus phase shift for signals at 29 GHz. For all three frequencies and for all possible phase shifts, the return loss remains better than −19 dB.

Figure 10:
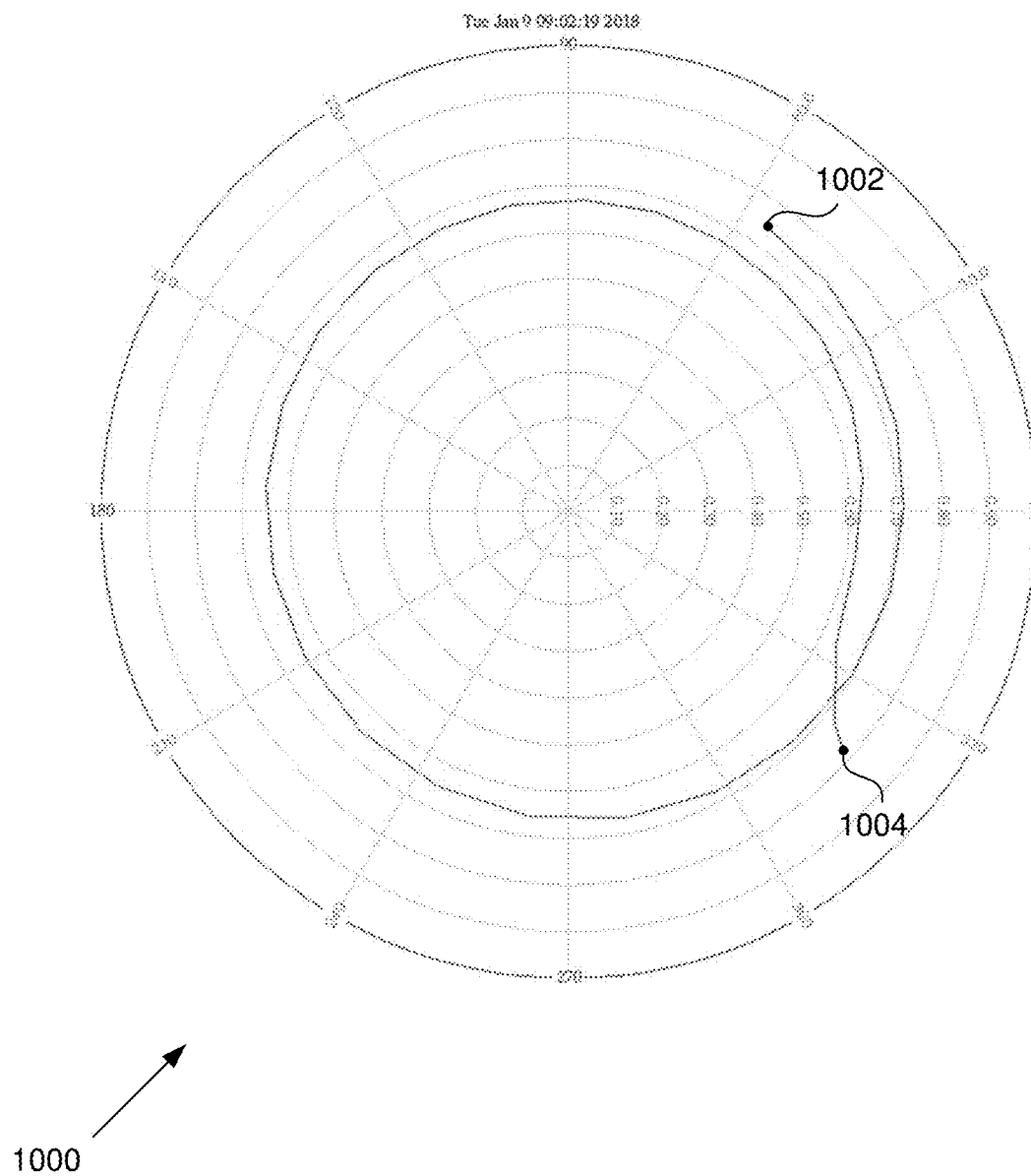
FIG. 10 is a polar plot of the insertion loss and phase over the full range of possible phase selections.

FIG. 10 is a polar plot 1000 of the insertion loss and phase over the full range of possible phase selections. A first point 1002 shows the insertion loss and phase for the shortest possible ATL 411 (i.e., with the $32^{nd}$ output control line 604 active). A second point 1004 shows the insertion loss and phase for the longest possible ATL (i.e., with none of the output control lines 604 active). It can be seen that the insertion loss increases as the ATL gets longer. However, at the point 1004 at which the ATL is the longest, the insertion loss is even lower than at the point at which the ATL is shortest. This is the case for the architecture in which the ATL 411 is longest with all of the FETs 414 turned off and the distal end of the ATL 411 shorted directly to ground. In each other state, the $R_{ON}$ associated with the FETs 414 through which the ATL 411 is grounded, taken together with the resistance of the central trace 526, increases the insertion loss as the length of the ATL 411 increases. However, once the end of the ATL 411 is a direct short to ground (i.e., not directed to ground through a FET 414), the total resistance is less than the on resistance, $R_{ON}$ of a pair 530 of FETs 414.

It should be further noted that while the ground at the distal end of the ATL 411 is present for all states of the output control lines 604, the effective signal is reflected based on the electrical length to the first FET 414 that is turned on. Therefore, the resistance of the ATL 411 beyond that FET 414 is not relevant, since only signals that reflect off of the ground coupled through that first FET 414 will be relevant.

Figure 11A:
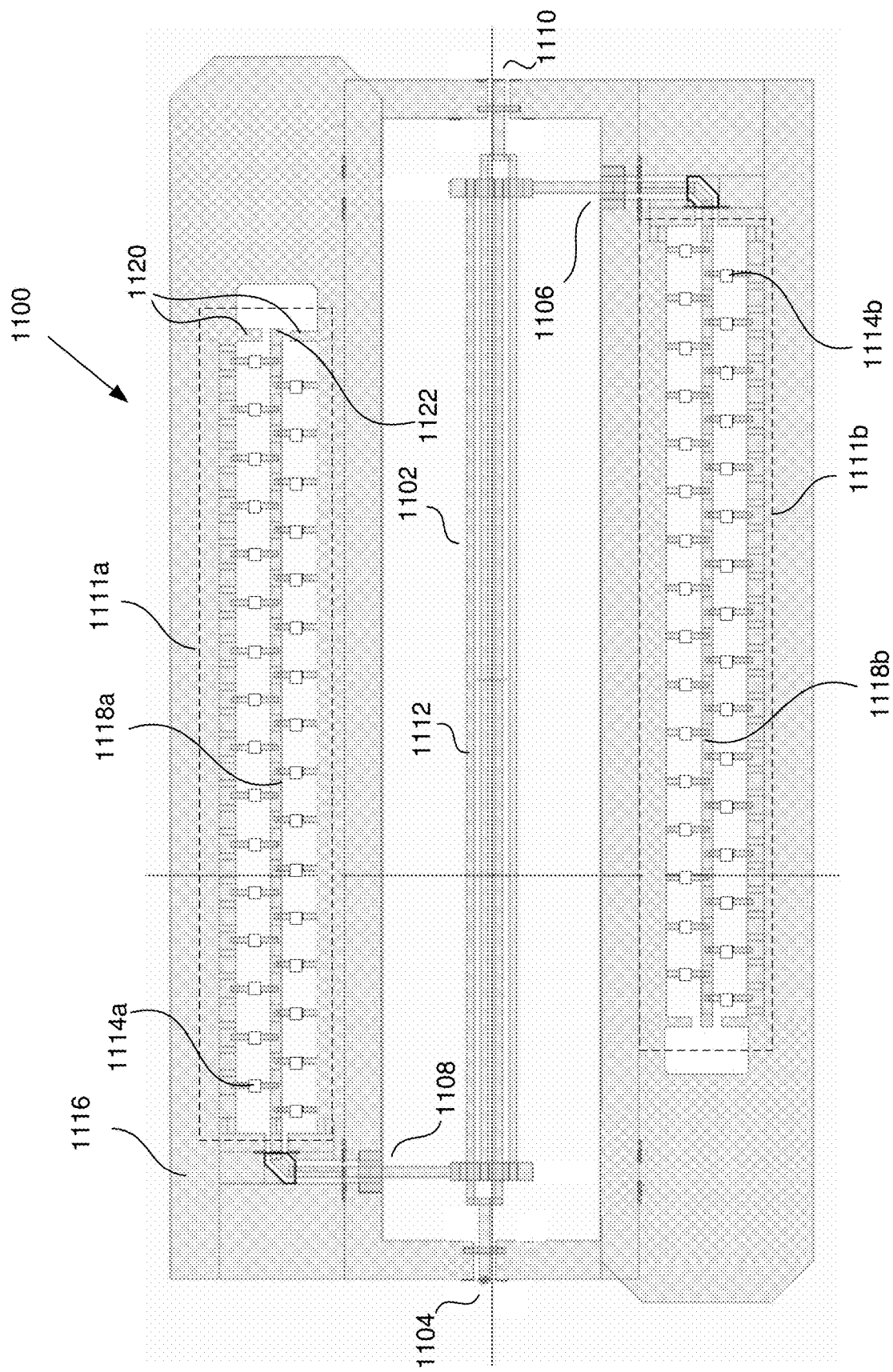
FIG. 11A is an illustration of the layout of another embodiment of a phase shifter in accordance with the disclosed apparatus in which the size of the phase shift steps is reduced by staggering the FETs on each side of the central trace.

FIG. 11A is an illustration of the layout of another embodiment of a phase shifter 1100 in accordance with the disclosed apparatus in which the size of the phase shift steps is reduced by staggering the FETs 1414 on each side of the central trace 1118. A Lange coupler 1102 similar to the Lange coupler 402 shown in FIG. 5A and FIG. 5B is provided. The Lange coupler 1102 has four ports: (1) an RF input port 1104; (2) a direct port 1106; (3) a coupled port 1108; and (4) an isolation port 1110. The direct port 1106 and the coupled port 1108 are each coupled to ATLs 1111 built from inductive tracks 1118 and FETs 1114. In the layout of the phase shifter 1100, a section of ground conductor 1116 connected to ground potential essentially surrounds each ATL 1111 and the coupler 1102. The ground conductor 1116 provides a ground to which each of the FETs 1114 can be connected. In addition, the spacing between the ground conductor 1116 and the central trace 1118 causes capacitance to be present along the ATL 1111. The amount of capacitance is a function of the distance between the central trace 1118 and the ground conductor 1116. It should be noted that those FETs 1114 that are not conducting (i.e., are turned off) also provide capacitance along the ATLs 1111. One difference between the layout of the phase shifter 400 and the phase shifter 1100 is the fact that the FETs 1114 in the phase shifter 1100 are staggered on each side of the central trace 1118. In contrast, the FETs 414 of the phase shifter 400 are aligned in pairs, each FET 414 of a pair being the same distance from the reflective port 406, 408 to which the central trace 526 is coupled. Accordingly, the FETs 1114 of the phase shifter 1100 can be turned on one at a time, rather than operating them in pairs 530 as is done in the phase shifter 400. This allows greater resolution in the phase shifts for a central trace 1118 of essentially the same length as the central trace 526 of the phase shifter 400, even with the same spacing between FETs 1114 on the same side of the central trace 1118 as in the phase shifter 400. It should be noted that in some embodiments, whenever a FET 1114 coupled to the central trace 1118a and spaced a distance from the reflective port 1108 is turned on, a FET 1114 coupled to the central trace 1118b and spaced an equal distance from the reflective port 1106 is turned on. Accordingly, the electrical length of the two ATLs 1111a, 1111b remains the same. Accordingly, as is the case with the FETs 414 of the phase shifter 400, all FETs 1114 that are the same distance from a reflective port 1106, 1108 are turned on together.

In some embodiments, the distal end 1122 of each of the central traces 1118 of the phase shifter 1100 are coupled to the ground conductor 1116 (not shown in FIG. 11A, but similar to the case shown in FIG. 5A and FIG. 5B for the phase shifter 401, 400). However, in other embodiments as shown in FIG. 11A, the distal end 1122 of the central traces 1118 is terminated in a pair of resistors (not shown) between the protrusions 1120 that extend from the ground conductor 1116 and the distal end 1122 of the central trace 1118. These resistors are chosen to equal the on-resistance of a terminating FET. Accordingly, they serve to reduce the abrupt change in insertion loss seen in FIG. 10 at point 1004. Similar resistive terminations (not shown for the sake of simplicity) may also be provided in an embodiment of the phase shifter 400 rather than having the distal ends 532 of the central traces 526 coupled directly to ground, as is shown in FIG. 5A and FIG. 5B.

It should be noted that in an embodiment in which the FETs 1114 are staggered, the FETs 1114 of one ATL 1111 are each driven independently. Therefore, the number of unique control lines will double (control lines that can be independently controlled, i.e., the number of control bits at the input to the N to $2^N$ encoder increases by 1 and the number of output control lines will double). In the phase shifter 400 in which the FETs 414 on one side of the central trace 526 are aligned with FETs 414 on the other side of the central trace 526, the same unique output control line 604 (See FIG. 7) can be used to turn both FETs of a pair 530 on. However, in the embodiment in which FETs 1114 on one side of the central trace 1118 are staggered with respect to the FETs 1114 on the other side of the central trace 1118, each FET 1114 will require a unique output control line 604.

Figure 11B:
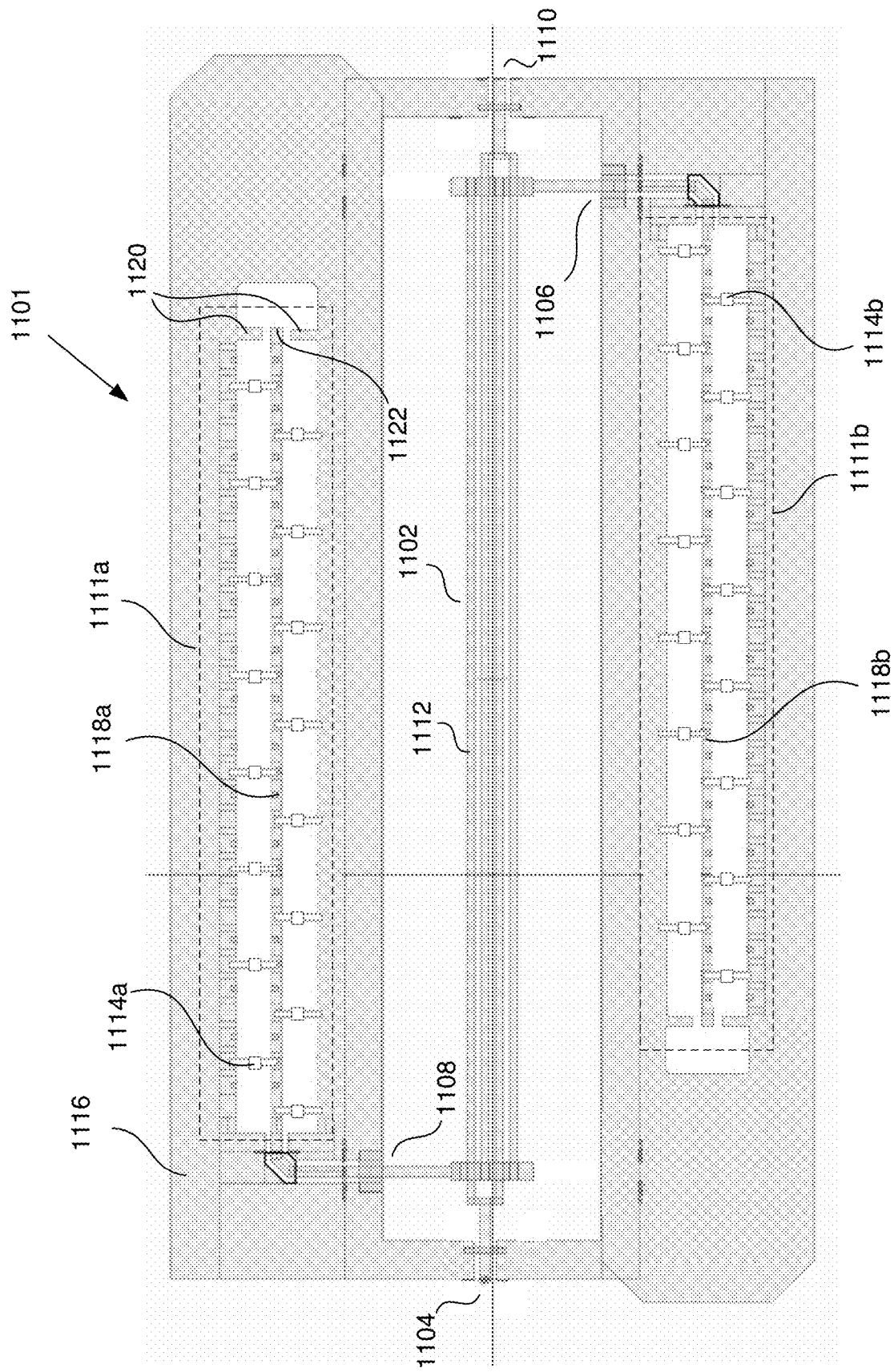
FIG. 11B is an illustration of an alternative layout of a phase shifter in which the distance between the FETs on each side of the ATLs is increased and the total number of FETs is decreased to keep the same number of phase steps and unique control lines as in the phase shifter of FIG. 11A.

FIG. 11B is an illustration of an alternative layout of a phase shifter 1101 in which the distance between the FETs 1114a on each side of the ATLs 1111 is increased and the total number of FETs 1114 is decreased to keep the same number of phase steps and unique control lines 604 as in the phase shifter 1100 of FIG. 11A.

Figure 12:
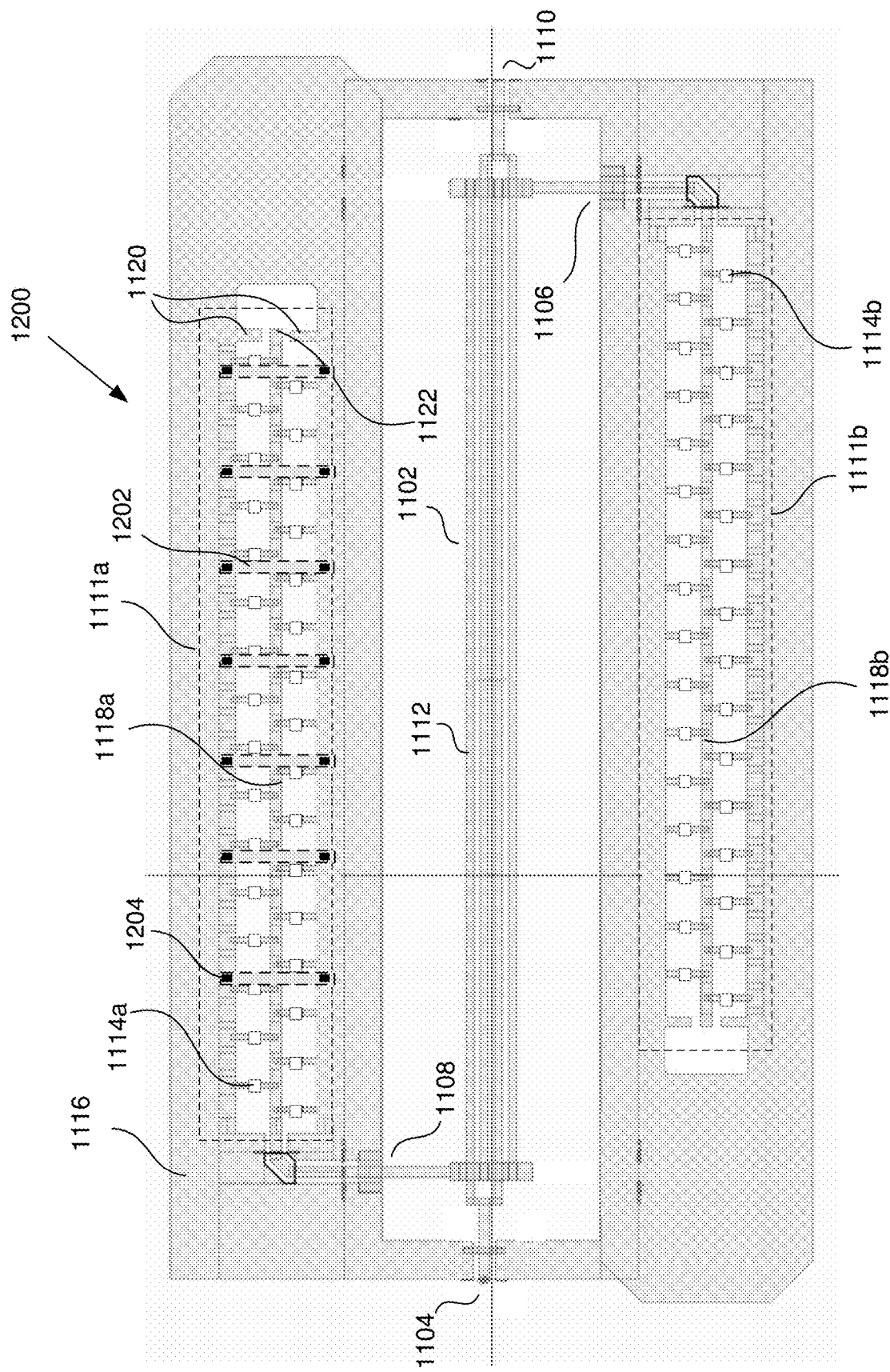
FIG. 12 is an illustration of an embodiment of a phase shifter in accordance with some embodiments in which additional connections are provided between the ground conductor on the two sides of the central trace of each ATL.

FIG. 12 is an illustration of an embodiment of a phase shifter 1200 in accordance with some embodiments in which additional connections (ground straps 1202) are provided between the ground conductor 1116 on the two sides of the central trace 1118 of each ATL 1111a, 1111b. Such ground straps 1202 can be implemented on a metal layer that is either above or below the layer on which the central trace 1118 is fabricated. In some such embodiments, vias 1204 connect the ground straps 1202 to the ground conductor 1116 on each side of the central trace 1118. The particular placement of the ground straps 1202 shown in FIG. 12 is merely provided to illustrate the concept. The particular locations of such ground straps 1202 can be determined based on the specifics of the implementation.

Figure 13:
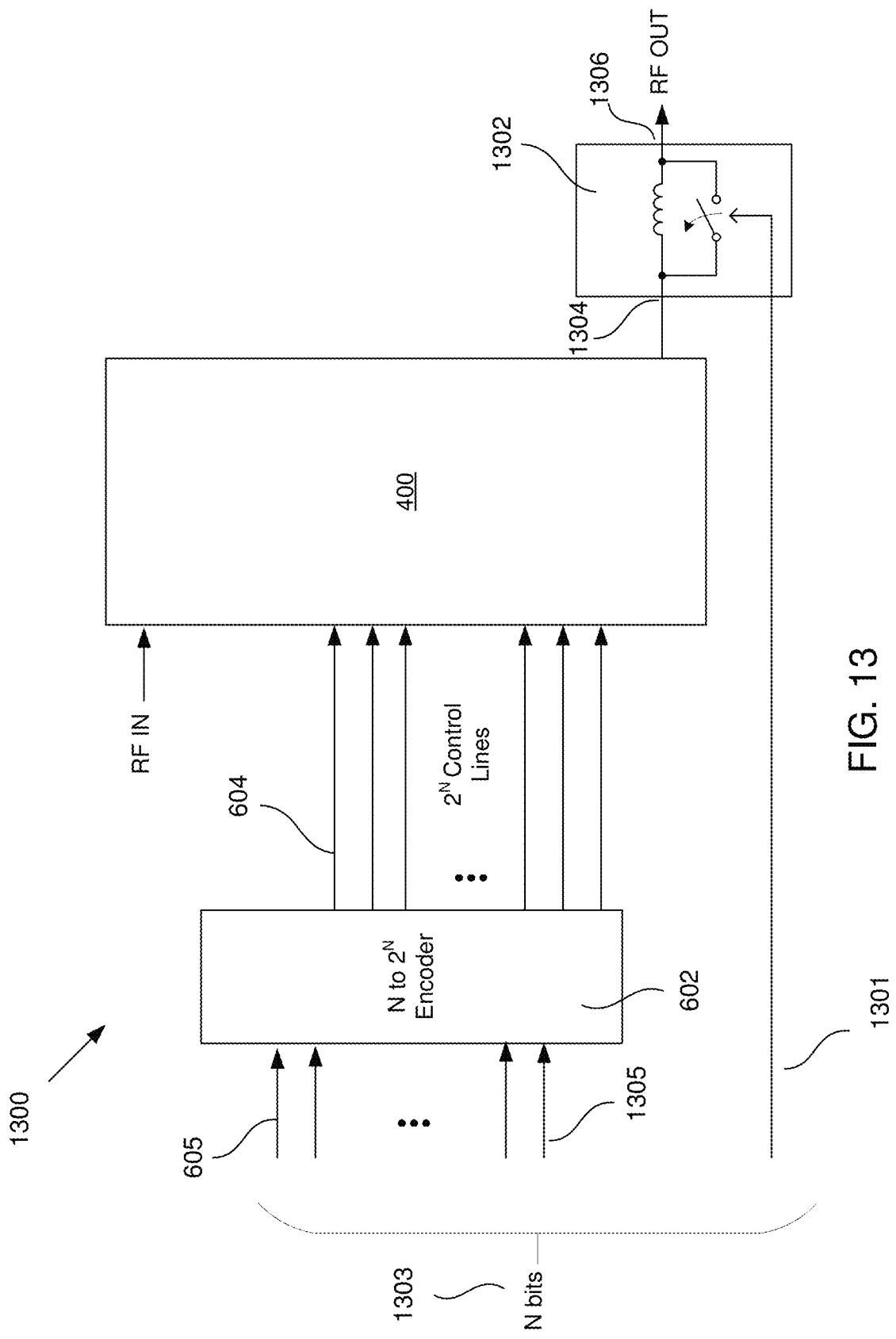
FIG. 13 is a schematic of a second alternative embodiment for increasing the resolution of the phase shifter.

FIG. 13 is a schematic of a second alternative embodiment for increasing the resolution of the phase shifter 400. In the embodiment of the disclosed phase shifter 1300, the general architecture of the phase shifter 400 shown in FIG. 4, FIG. 5A and FIG. 5B is used together with an externally switched reactance 1302. An additional input control line 1301 is coupled to the externally switched reactance 1302 to determine the amount of reactance to be applied between the input 1304 and output 1306 of the externally switched reactance 1302. The externally switched reactance 1302 can be used as an alternative to, or in combination with, staggering the FETs 1114, as shown in FIG. 11A and FIG. 11B. The following discussion applies to the phase shifter 400, but would apply equally well if the phase shifter 1100 or phase shifter 1101 were used with an externally switched reactance 1302.

In some embodiments, the additional bit 1301 is the least significant bit (LSB) of a N-bit control word 1303 used to determine the amount of phase shift to be applied to the RF output signal by the phase shifter 1300. The reactance of the externally switched reactance 1302 when the control line 1301 is "active" is selected to cause a phase shift that is approximately half as large as the phase shift that results from the next least significant bit 1305 of the control word 1303. Accordingly, as the control word 1303 sequences through all possible values from the lowest to the highest, it sets the control lines 604, 1301 to shift the phase of the output of the shifter 1300 in incremental steps approximately equal in size to the size of the phase shift caused by changing the state of the LSB 1301.

Figure 14:
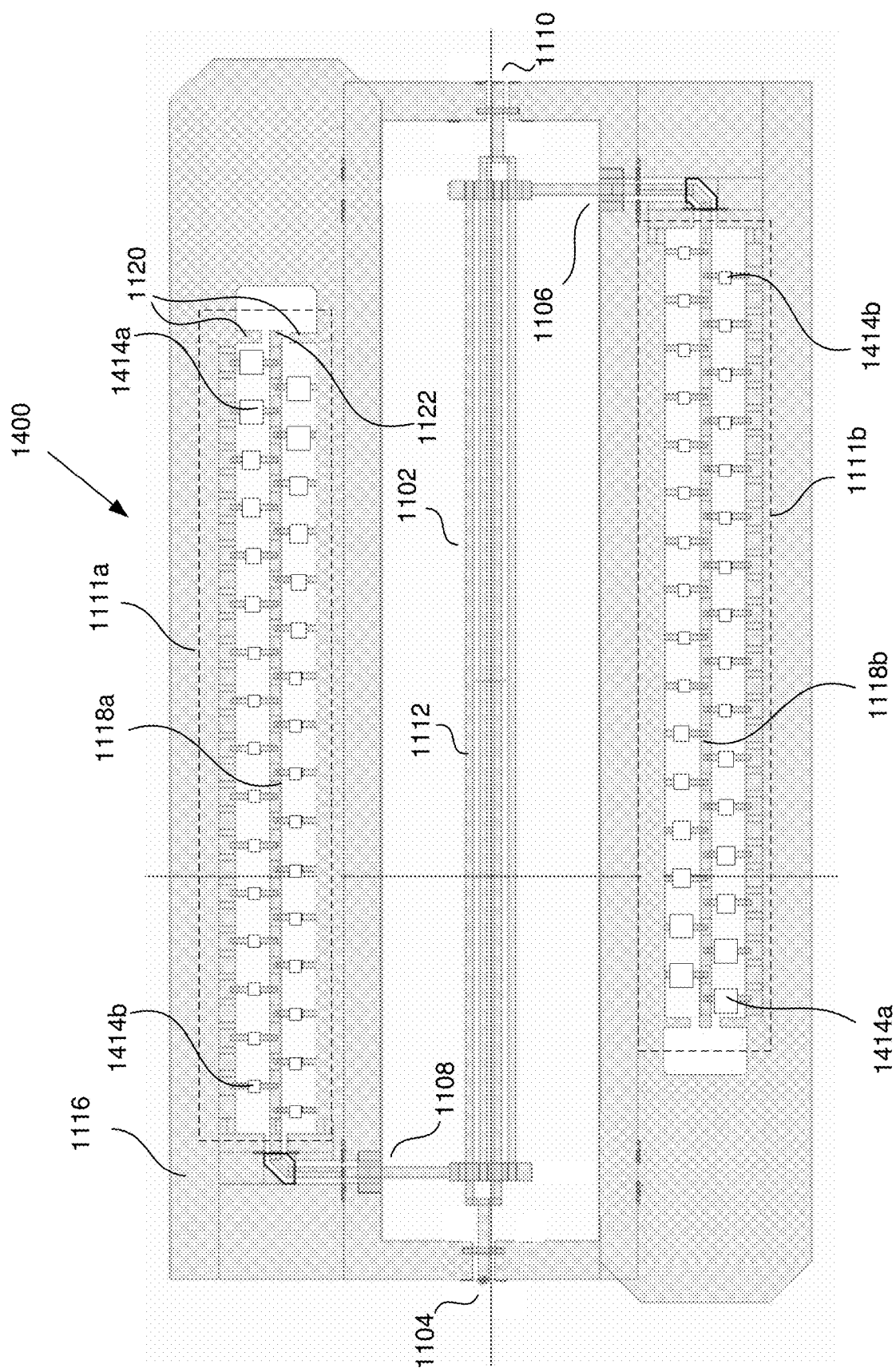
FIG. 14 is an illustration of another embodiment of the phase shifter.

FIG. 14 is an illustration of another embodiment of the phase shifter. The phase shifter 1400 is essentially the same as the phase shifter 1100 shown in FIG. 11A. However, those FETs 1414a of the phase shifter 1400 that are farther from the reflective ports 1106, 1108 are larger than the FETs 1414b that are closer to the reflective ports 1106, 1108. Making the FETs 1414b larger reduces the $R_{ON}$ (resistance from drain to source in the on state, i.e., when conducting). Reducing the $R_{ON}$ of FETs farther along the ATL 1111 compensates for increases in the central trace 1118 resistance added by the increased distance between the reflective ports 1106, 1108 and the FETs 1414a. It should be noted that in some embodiments, the FETs 1414 farther from the reflective ports 1106, 1108 on one end of the central trace 1118a have a lower on $R_{ON}$. In some embodiments, this is provided by making them wider than the FETs 1414 closer to the reflective ports 1106, 1108. However, on the other end of the central trace 1118a, the FETs 1414 all have the same $R_{ON}$. However, in order to maintain the symmetry between the two reflective ports 1106, 1108, the FETs 1414 associated with the other central trace 1118b will each be the same size as the corresponding FETs associated with the central trace 1118a. That is, the total impedance along each central trace 1118 will be the same when corresponding FETs 1414 associated with each central trace 1118 are turned on.

Figure 15:
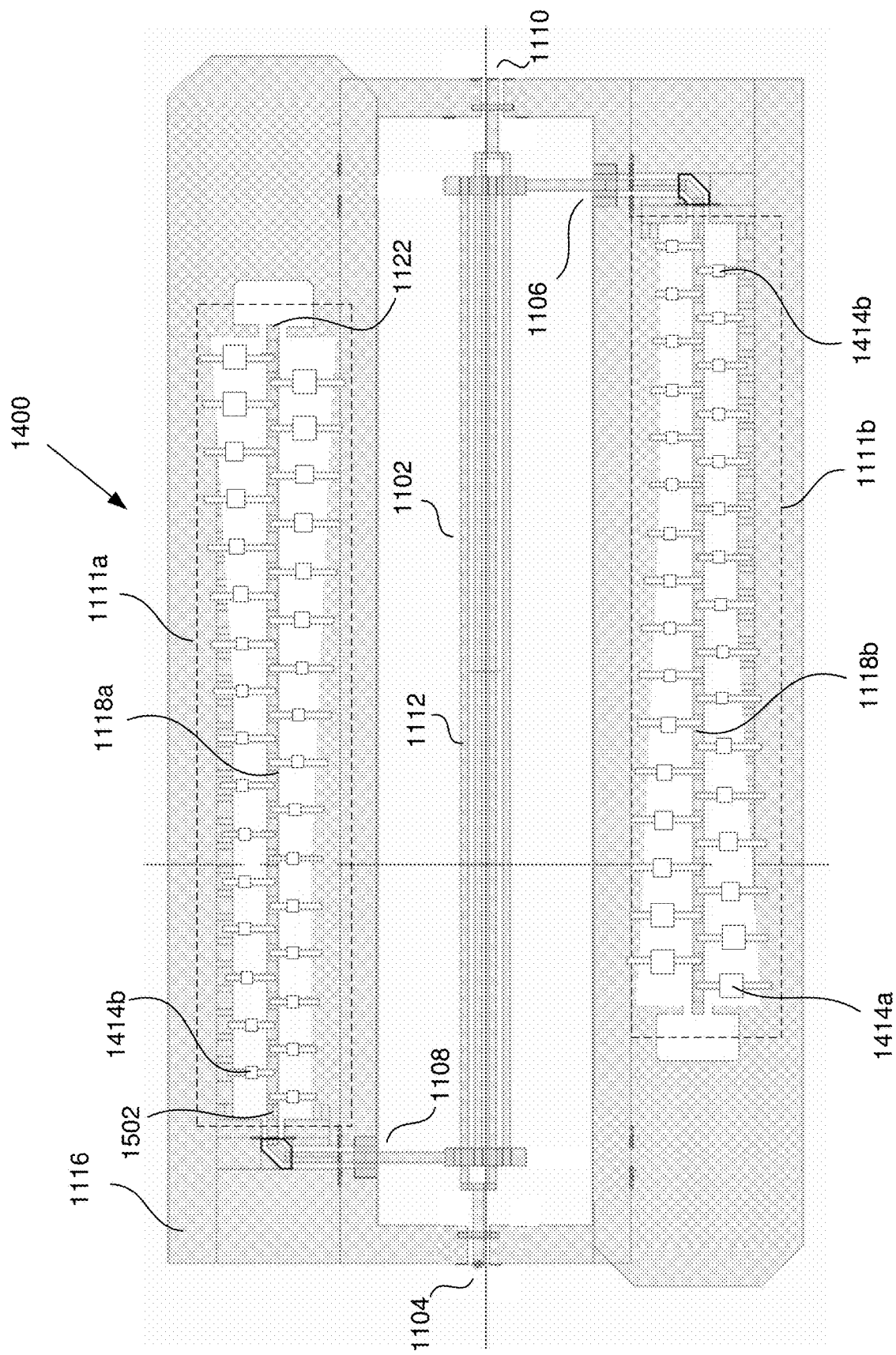
FIG. 15 illustrates yet another embodiment in which the distance between the central trace and the ground conductor is tapered such that the amount of capacitance between the central trace diminishes.

FIG. 15 illustrates yet another embodiment in which the distance between the central trace 1118 and the ground conductor 1116 is tapered such that the distance between the ground conductor 1116 and the central trace 1118 is greater at the distal end of the central trace 1118 then at the proximal end. Accordingly, the amount of capacitance between the central trace 1118 and ground diminishes over length of the ATL 1111, with the distal end 1122 of the ATL 1111 having less capacitance to ground than at the proximal end 1502 due to the wider distance to ground at the distal end. Tapering the ground conductor 1116 compensates for increases in capacitance due to the increased size of the FETs 1414 towards the distal end 1122. It should be noted that in some embodiments, the ground conductor 1116 is tapered on one end of the central trace 1118a. However, on the other end of the central trace 1118a, the ground conductor 1116 is not tapered (not shown). However, in order to maintain the symmetry between the two reflective ports 1106, 1108, the ground conductor 1116 associated with the other central trace 1118b will have the same taper as the corresponding ground conductor 1116 associated with the central trace 1118a. That is, the total impedance along each central trace 1118 will be the same when corresponding FETs 1414 associated with each central trace 1118 are turned on.

The layout shown in FIGS. 5A, 5B, 11A, 11B, 12, 14 and 15 are merely examples of how the coupler and associated FETs may be laid out in some embodiments of the disclosed apparatus. The number of alternative layouts is large and not provided here, since one of ordinary skill in the art would be able to determine an appropriate layout for the particular application in which the disclosed phase shifter is to be used. More specifically, we have presented binary coded phase shifts in equal increments, yet a person of ordinary skill will understand that many coding schemes and increments are possible from thermometer codes up through random codes of discrete phase shifts.

Figure 16:
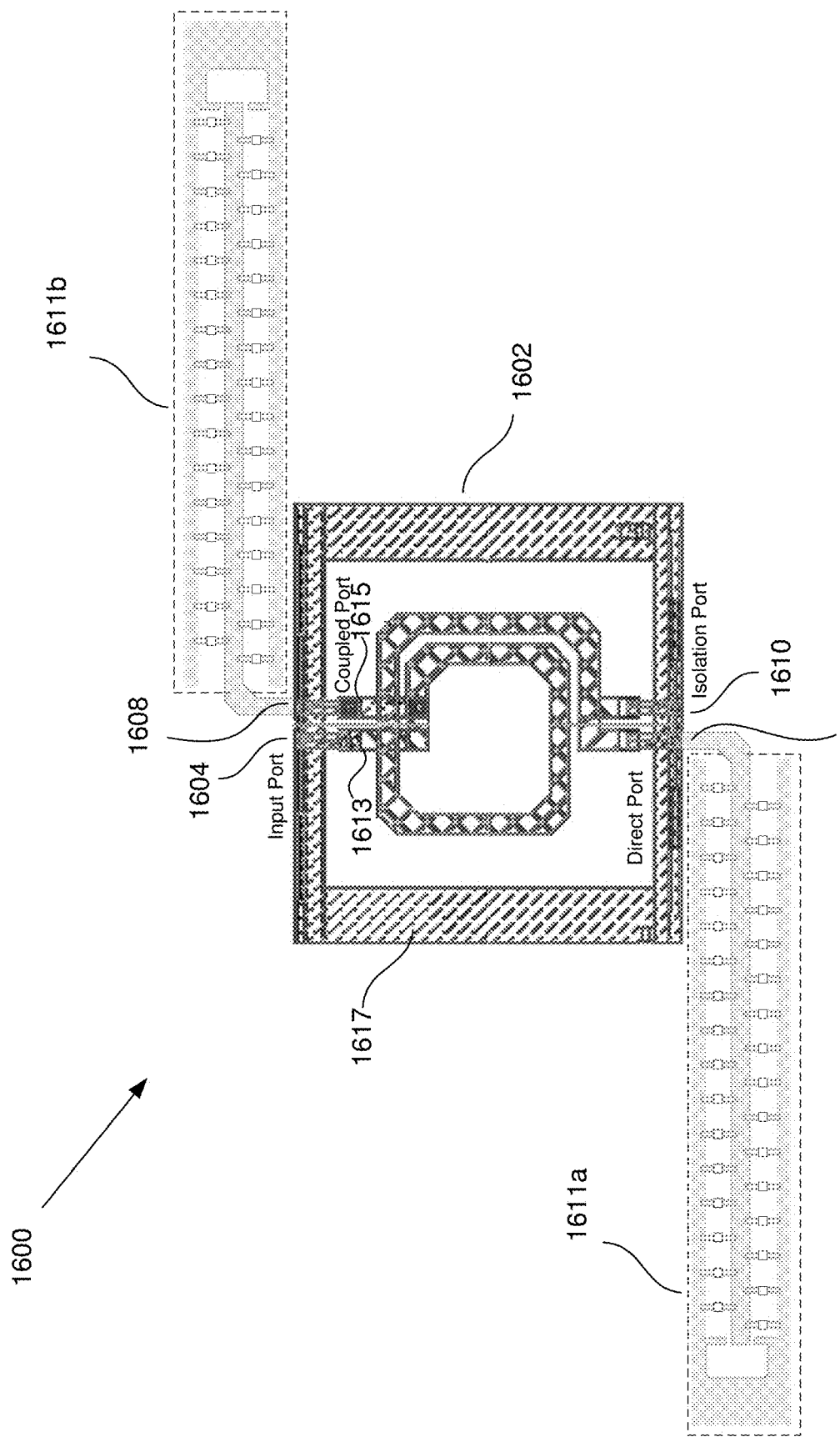
FIG. 16 is an alternative embodiment of a phase shifter in which the Lange coupler of the previously discussed embodiments is replaced with a hybrid transformer-based coupler.

FIG. 16 is an alternative embodiment of a phase shifter 1600 in which the Lange coupler of the previously discussed embodiments is replaced with a hybrid transformer-based coupler 1602. The hybrid coupler 1602 has four ports, similar to the Lange coupler: (1) input port 1604; (2) a direct port 1606, (3) a coupled port 1608, and (4) an isolation port 1610. The direct port 1606 and the coupled port 1608 are each coupled to one of two ATLs 1611a, 1611b, similar to the previous discussed ATLs. In accordance with some embodiments, two serpentine traces 1613, 1615 are laid one on top of the other (i.e., the first trace 1613 is formed on a first layer and the second trace 1615 is formed on a second layer above the first layer). The ends of each trace serve as the four ports 1604, 1606, 1608, 1610. Surrounding the central portion of the two traces 1613, 1615 is a section of ground 1617.

The phase shifter 1600 operates essentially the same as the phase shifter 400 previously discussed. However, the use of the hybrid coupler 1602 in the phase shifter 1600 results in different operating characteristics, as well as a different footprint.

Figure 17:
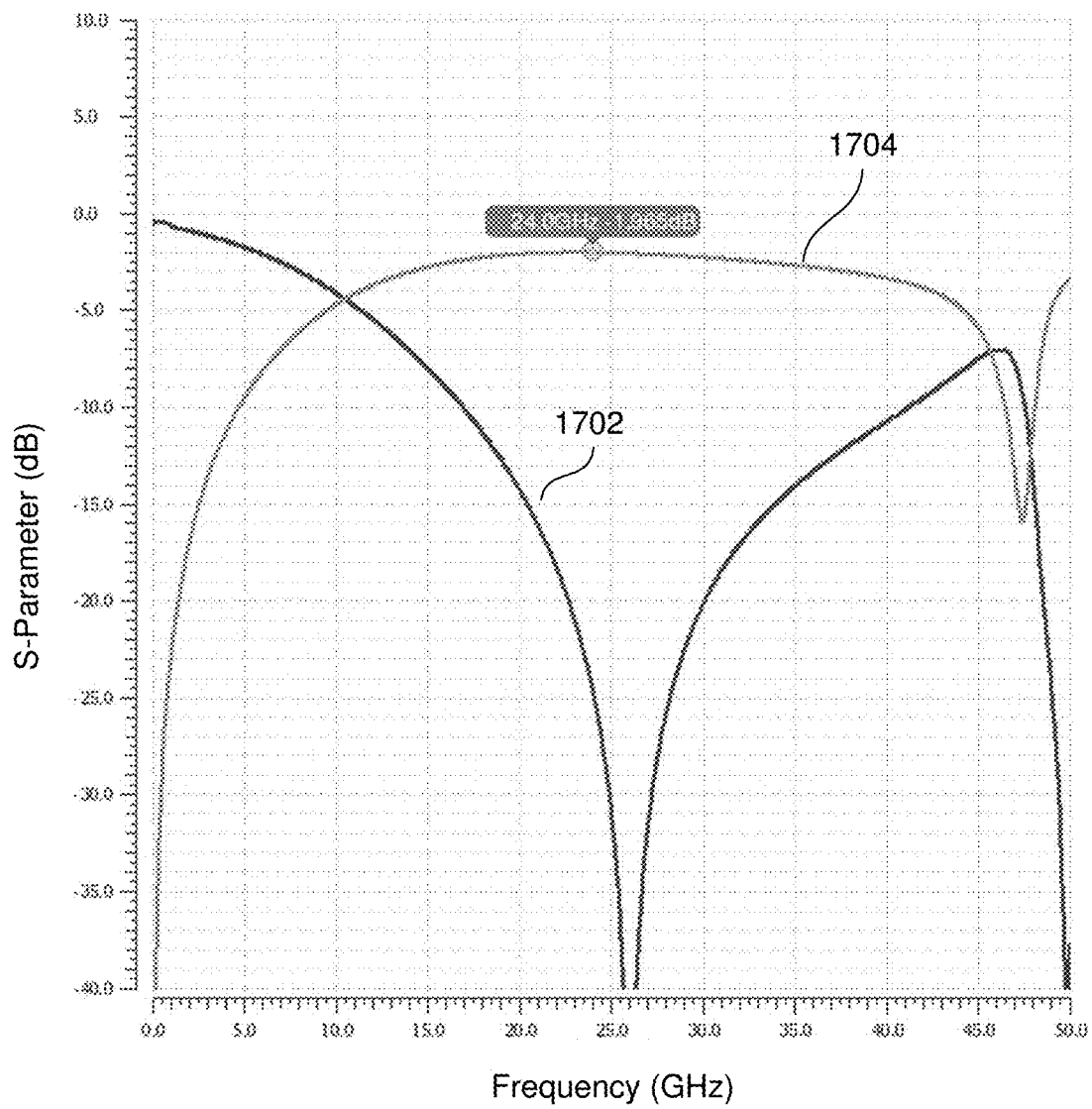
FIG. 17 is a graph showing the return loss and insertion loss the over frequency for the phase shifter having a Lange coupler.

FIG. 17 is a graph showing the return loss 1702 and insertion loss 1704 the over frequency for the phase shifter 400 having a Lange coupler 402. At 24 GHz, the insertion loss is 1.965 dB and the return loss is approximately −25 dB.

Figure 18:
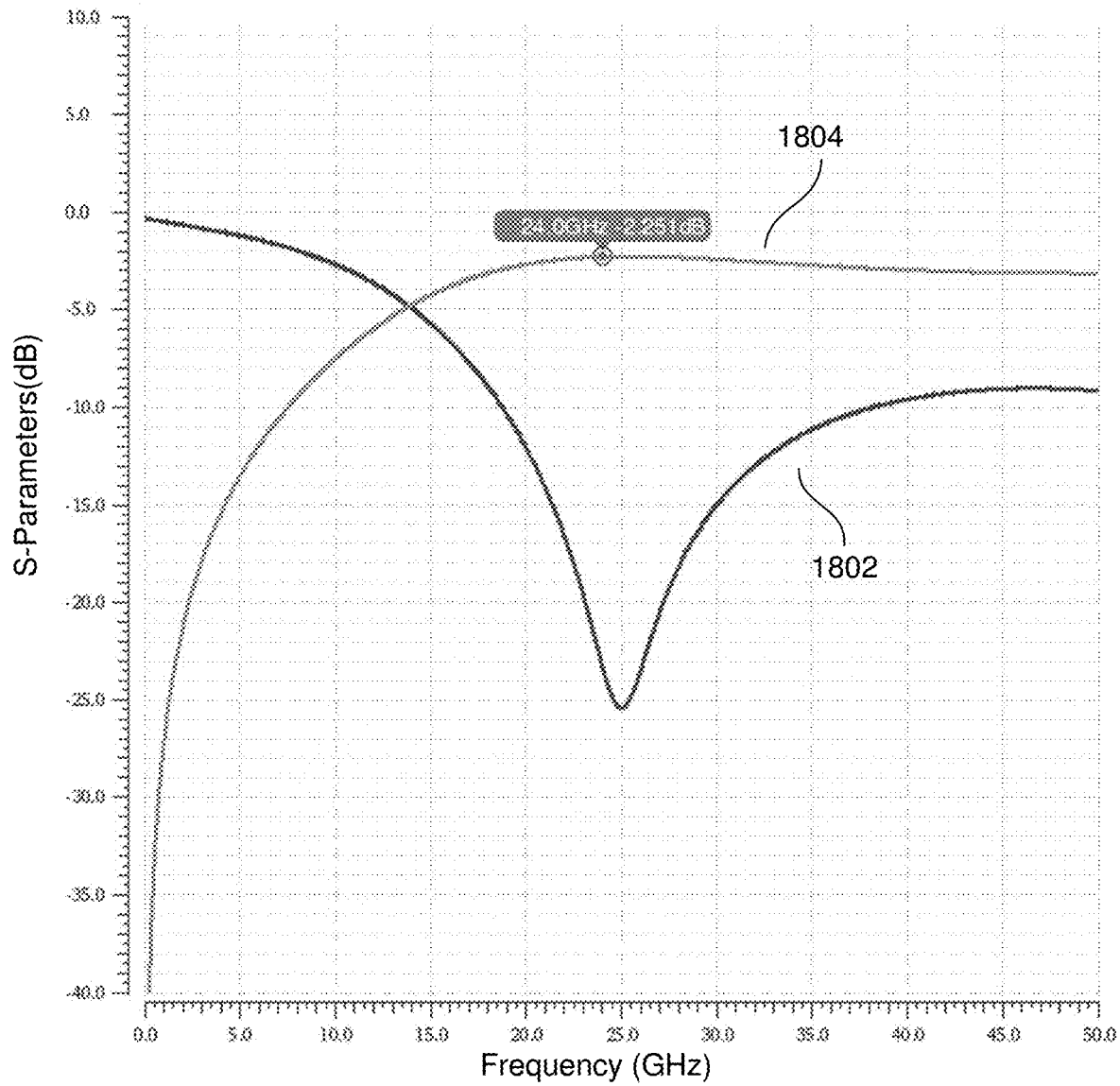
FIG. 18 is a graph showing the return loss and insertion loss the over frequency for the phase shifter having a hybrid coupler.

FIG. 18 is a graph showing the return loss 1802 and insertion loss 1804 over frequency for the phase shifter 1600 having a hybrid coupler 1602. In contrast to the phase shifter 400 having a Lange coupler, the phase shifter 1600 having a hybrid coupler has greater insertion loss (i.e., −2.251 dB at 24 GHz) and worse return loss (i.e., −23 dB at 24 GHz). Nonetheless, in some applications, the phase shifter 1600 may be advantages. For example, the overall footprint of the phase shifter 1600 is smaller than that of the phase shifter 400. In addition, the hybrid coupler 1602 can be more useful in dual mode operation (i.e., operation at more than one frequency).

Figure 19:
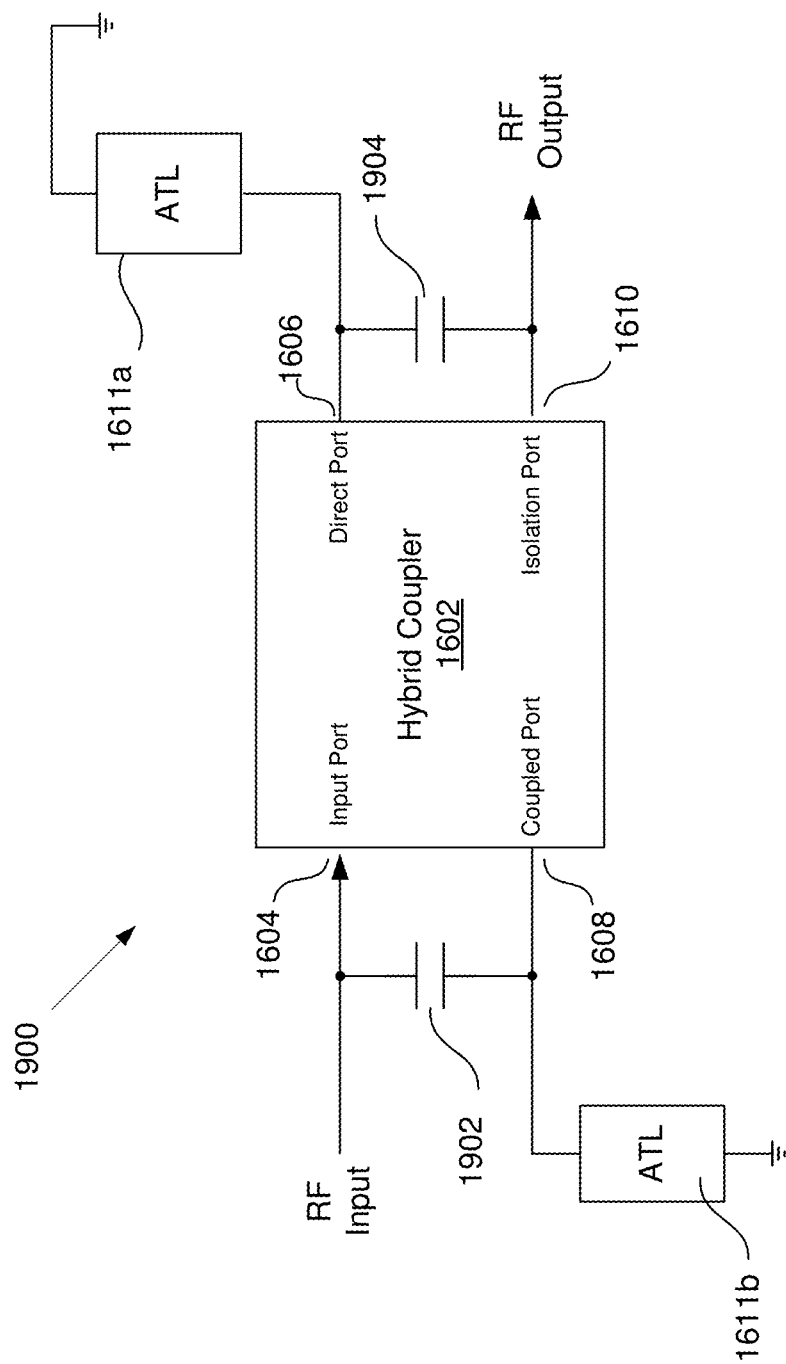
FIG. 19 is a schematic of a phase shifter using a hybrid coupler.

FIG. 19 is a schematic of a phase shifter 1900 using a hybrid coupler 1602, similar to that shown in FIG. 16. A first capacitor 1902 is placed between the input port 1604 and the coupled port 1608 and a second capacitor 1904 is placed between the isolation port (i.e., the output port) 1610 and the direct port 1606. Selecting appropriate values for these two capacitors 1902, 1904 allows the phase shifter 1900 to be tuned to optimize the return loss of the phase shifter 1900 at a particular frequency of interest. Accordingly, providing first and second capacitances that are selectable makes it possible to optimize the phase shifter 1900 for operation in dual band systems (i.e., systems in which the operational frequency can be selected from one of two frequencies). Additional switched capacitors could be added to support further operating bands.

Figure 20:
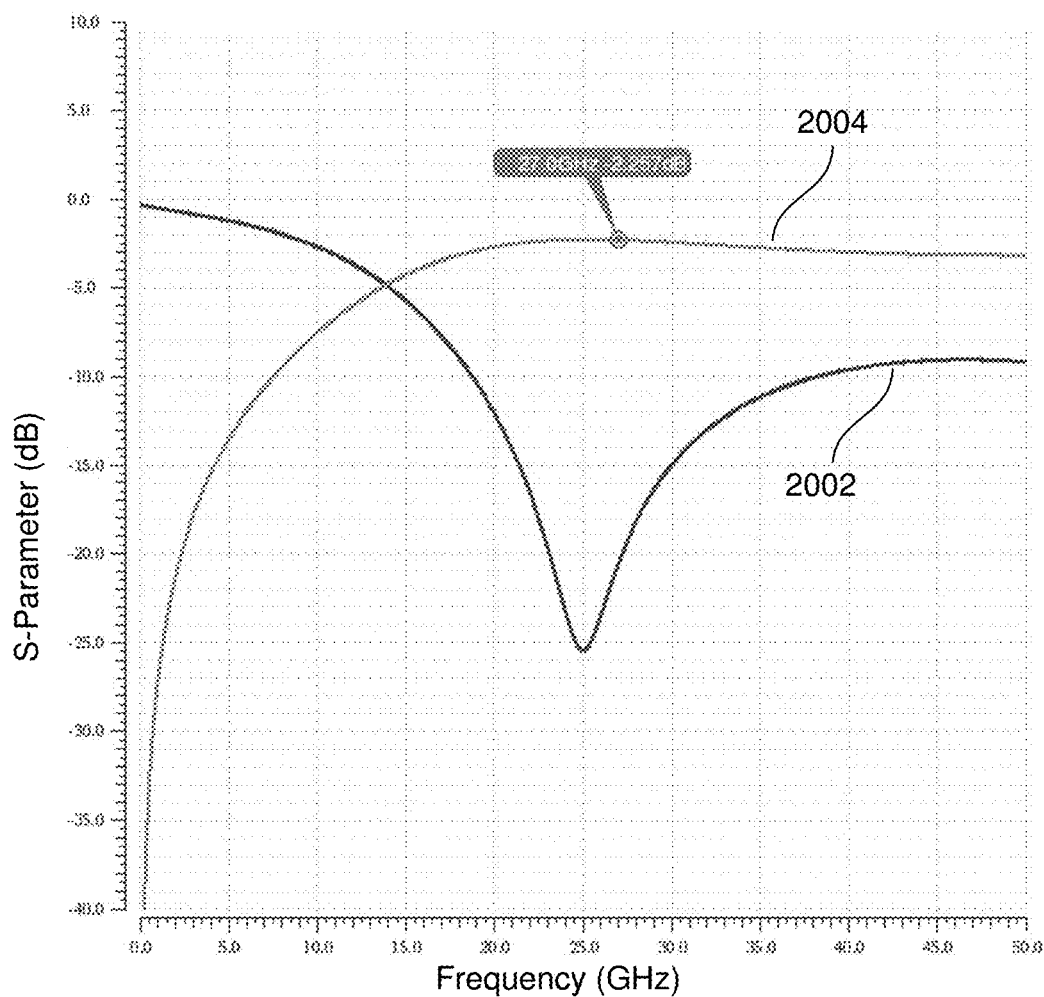
FIG. 20 is a graph showing the return loss and insertion loss for phase shifter in which the values of the capacitors are selected for operation at approximately 27 GHz.

FIG. 20 is a graph showing the return loss 2002 and insertion loss 2004 for phase shifter 1900 in which the values of the capacitors 1902, 1904 are selected for operation at approximately 27 GHz. The return loss is approximately −20 dB and the insertion loss is −2.257 at 27 GHz. While the phase shifter 400 has better insertion loss and return loss at 24 GHz, as seen from FIG. 17, the return loss and insertion loss of the phase shifter 1600 is acceptable in many applications.

Figure 21:
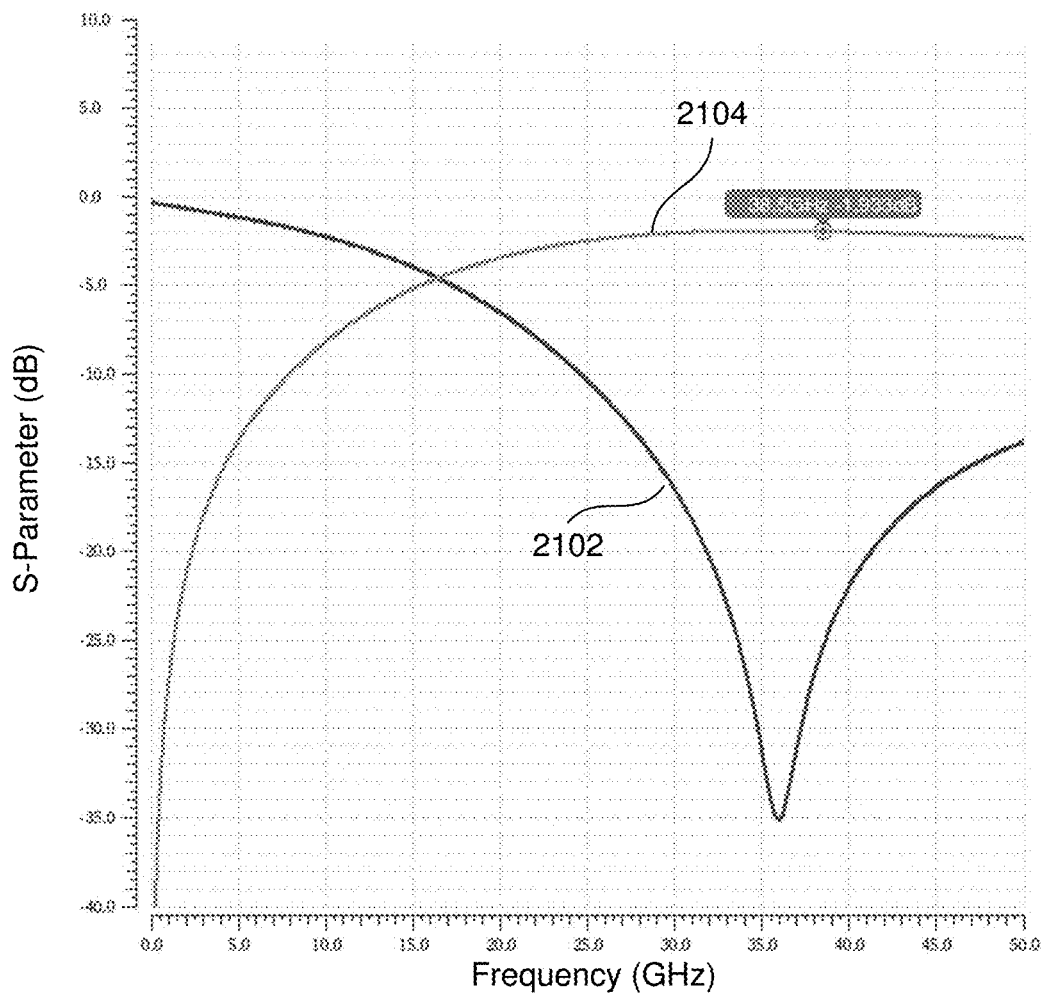
FIG. 21 is a graph showing the return loss and insertion loss for phase shifter in which in which the values of the capacitors are selected for operation at approximately 38.5 GHz.

FIG. 21 is a graph showing the return loss 2102 and insertion loss 2104 for phase shifter 1900 in which in which the values of the capacitors 1902, 1904 are selected for operation at approximately 38.5 GHz. The return loss is approximately −35.0 dB and the insertion loss is −1.933 dB. In contrast, the phase shifter 400 as shown in FIG. 17 at 38.5 GHz has a return loss of −13.5 dB and an insertion loss of approximately −2.5 dB.

Figure 22:
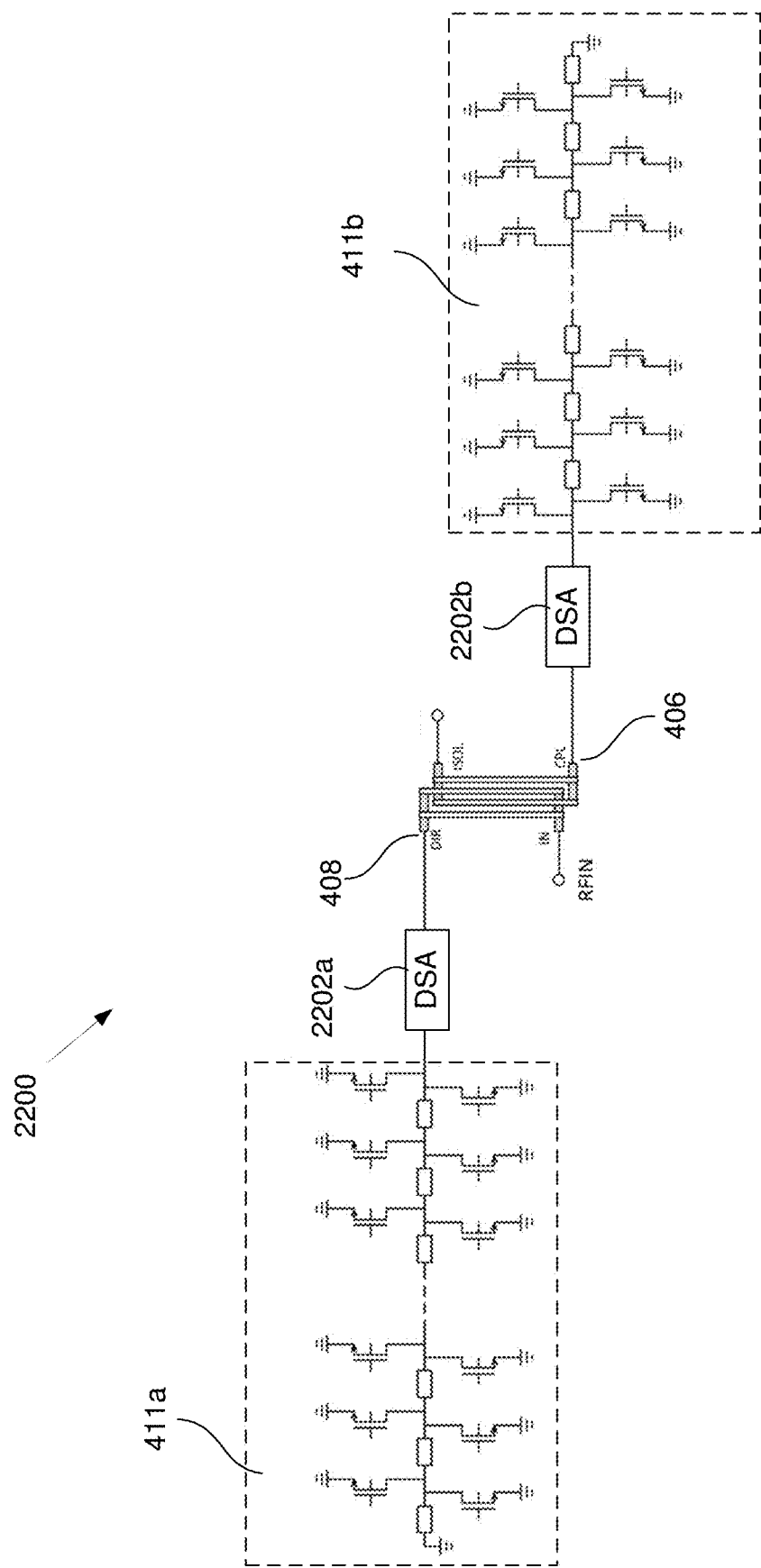
FIG. 22 is a schematic of yet another phase shifter in accordance with some embodiments of the disclosed apparatus.

FIG. 22 is a schematic of yet another phase shifter 2200 in accordance with some embodiments of the disclosed apparatus. The phase shifter 2200 is similar to phase shifter 400. However, the phase shifter 2200 includes integrated digital switched attenuators (DSA) 2202a, 2202b coupled between each reflective port 406, 408 and the associated ATL 411a, 411b.

Figure 23:
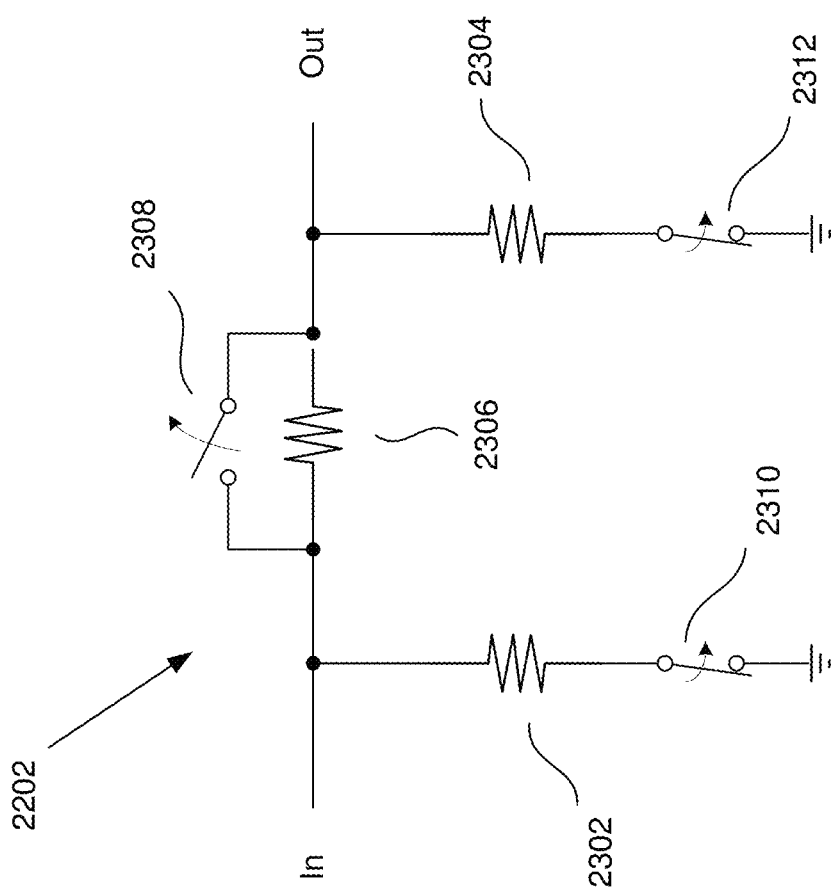
FIG. 23 is a simplified schematic of the DSA.

FIG. 23 is a simplified schematic of the DSA 2202. Resistors 2302, 2304, 2306 form a divider network to provide attenuation to the signals at the reflective ports 406, 408 (see FIG. 22). When the series switch 2308 is closed and the shunt switches 2310, 2312 are open, the ladder network is bypassed. Accordingly, no attenuation is provided. Alternatively, when the series switch 2308 is open and the shunt switches 2310, 2312 are closed, the ladder network divides the signal by an amount that is proportional to the relative size of the resistors 2302, 2304, 2306 in the ladder network. Control lines to the switches are not shown in FIG. 23. However, it will be clear to those skilled in the art that a signal control line can be provided to control all three switches 2308, 2310, 2312. Since the bypass switch 2308 is in the opposite state from the other two switches 2310, 2312, an inverter can be used to invert the control signal to the bypass switch, with respect to the control signal applied to the other two switches 2310, 2312. Accordingly, the DSA 2202 can be controlled by a single bit.

Figure 24:
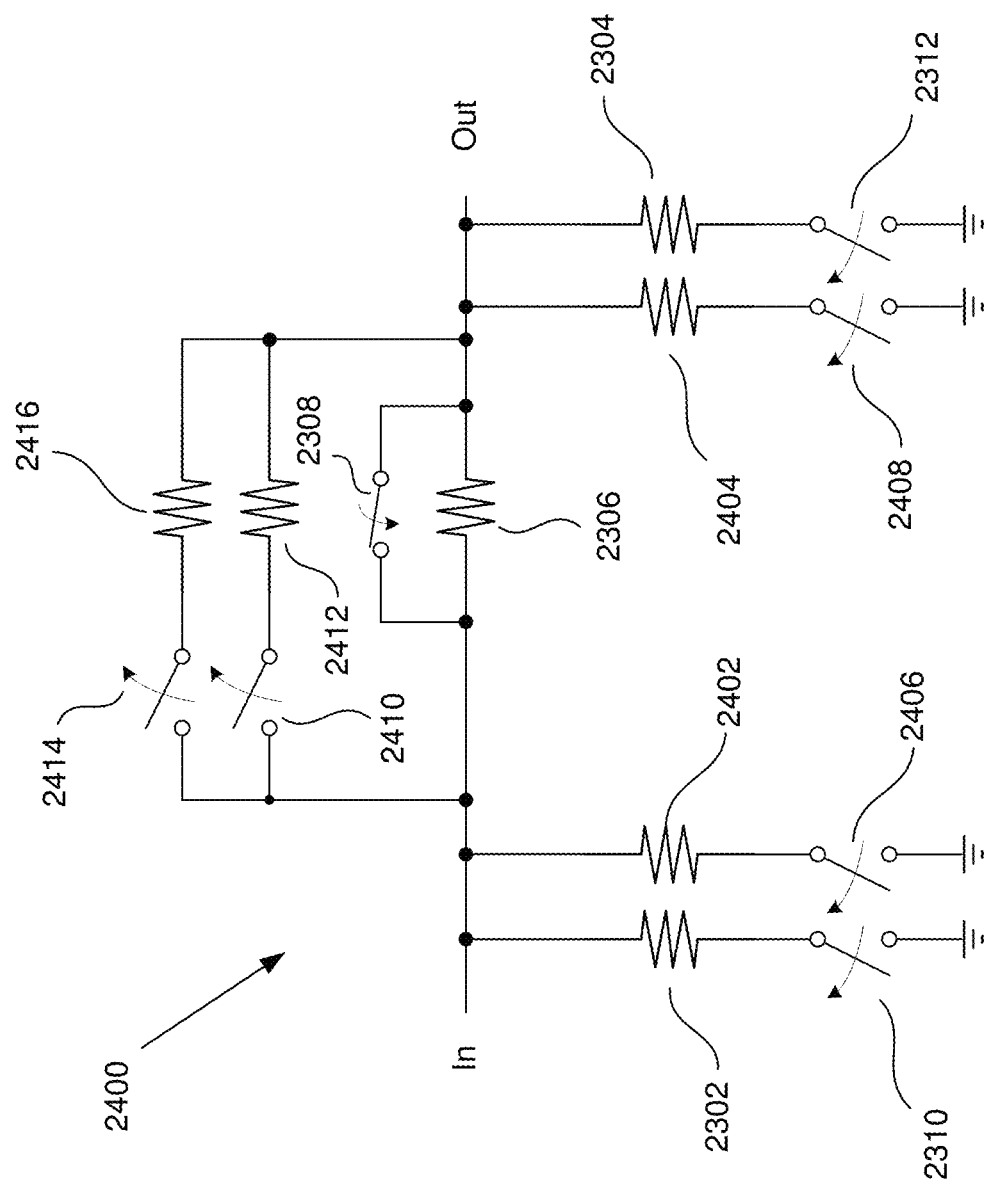
FIG. 24 is a simplified schematic of a DSA that can be used in place of the DSAs shown in FIG. 23.

FIG. 24 is a simplified schematic of a DSA 2400 that can be used in place of the DSAs 2202 shown in FIG. 22. The DSA 2400 has at least two attenuation values in addition to a bypass mode. In addition to the components discussed with regard to the DSA 2202 shown in FIG. 23, the DSA 2400 has additional series connected resistors 2402, 2404 and switches 2406, 2408 in parallel with the series connected resistors 2302, 2304 and switches 2310, 2312. In addition, a first series connected switch 2410 and resistor 2412 and a second series connected switch 2414 and resistor 2416 are each placed in parallel with the resistor 2306 and switch 2308. A third additional attenuation state can be provided in which both resistors are placed in parallel (both series and shunt).

If the bypass switch 2308 is closed, all other switches are open to allow the DSA 2400 to be bypassed (i.e., no attenuation is provided). If the bypass switch 2308 is open, then a first level of attenuation is provided when the switches 2310, 2312, 2410 are closed and switches 2406, 2408, 2414 are open. A second level of attenuation is provided is the bypass switch 2308 and switches 2310, 2312, 2410 are open and switches 2406, 2408, 2414 are closed. Similar to the case discussed above with respect to the DSA 2202, the control lines of the DSA 2400 are not shown, but one of ordinary skill in the art will understand that the switches 2310, 2312, 2410 can be closed in a first state of a first control line. The same control line can be used to open the switches 2406, 2408, 2414 when the first control line is in the first state. When the first control line is in the second state, the switches 2310, 2312, 2410 can be open and the switches 2406, 2408, 2414 can be closed. A second control line can be used to determine whether the bypass switch 2308 is open or closed. Obviously, other control states are possible and can be arranged by means of standard logic.

It should be noted that the ATLs disclosed herein can also be used to provide a programmable time delay. That is, by selecting the electrical length of the ATL, the amount of time required for the signal to traverse the ATL changes, thus changing the amount of delay that is introduced. Hence, any of the circuits of FIGS. 4, 5A, 5B, 11A, 11B, 12, 14, 15 and 16 provide this function without modification.

Figure 25:
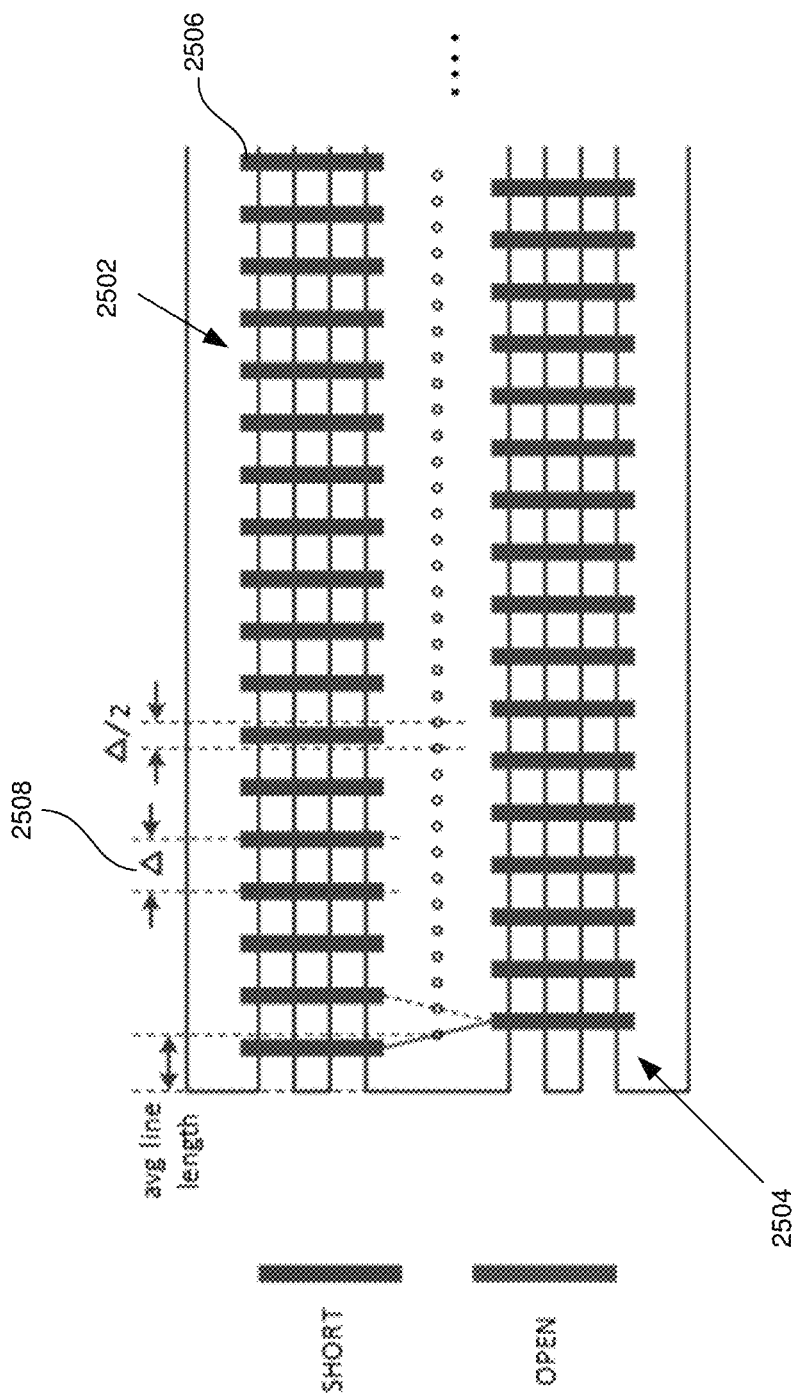
FIG. 25 is an illustration showing switches as red/blue bars spanning across the ATL transmission line.

As can be seen in FIG. 25, and in comparison to FIG. 5B, switch locations of the shorting switches within the two ATLs (upper 2502 and lower 2504 in FIG. 25) are asymmetrically located with respect to each other. The switches as shown in FIG. 25 are depicted as red or blue switchbars, denoting open or shorted. This figure shows the switches 2506 as red/blue bars spanning across the ATL transmission line 2502, 2504. This configuration can be seen in FIG. 5B, i.e., two switches spaced at the same point across the center conductor of the ATL. However, as seen in FIG. 11A, for example, to save area, a single switch may suffice on either side of the center conductor of the ATL and still serve to shorten the ATL length, albeit with slightly higher losses due to having only a single switch. In FIG. 25 the red/blue switch bars 2506 should be interpreted as being either a pair of switches, as in FIG. 5B, or a single switch, as in FIG. 11A.

In prior embodiments, the locations of the shorting switches (shown as red switch bars 2506 in FIG. 25) are equally distant from the proximal or distal end of each ATL, thereby creating the same electrical length on each ATL and therefore, as seen, each of the direct and coupled ports in the Lange coupler structure (not shown in FIG. 25).

In the initial embodiments, this means that the delay (phase change) of each of these ports are equal and therefore the average delay of the two ATLs is also equal to the delay of each line. However, in the present embodiment, by staggering the switch location delay by half the minimum delay 2508, as shown in FIG. 25, the delay introduced with each subsequent switch closing on opposite ATLs 2502, 2504 will be half the minimum delay of an individual ATL. More specifically, in FIG. 26 it can be seen that the first switch bar 2601 on the top ATL 2602 (in the first time sequence proceeding from top to bottom) is a half minimum spacing closer to the end of the ATL than is the first switch bar 2606 on the bottom ATL 2604 of the same first time sequence. This half spacing could not be achieved within a single ATL due to minimum spacing rules, however, the half spacing is achieved by starting the sequence of switch bars a half minimum spacing offset from one ATL as compared to the other. All other switch bars are then spaced at the minimum spacing along each of the ATLs, thereby ensuring all the switch bars on one ATL 2602 are spaced a half minimum spacing offset from the associated switch bar on the other ATL 2604.

Figure 26:
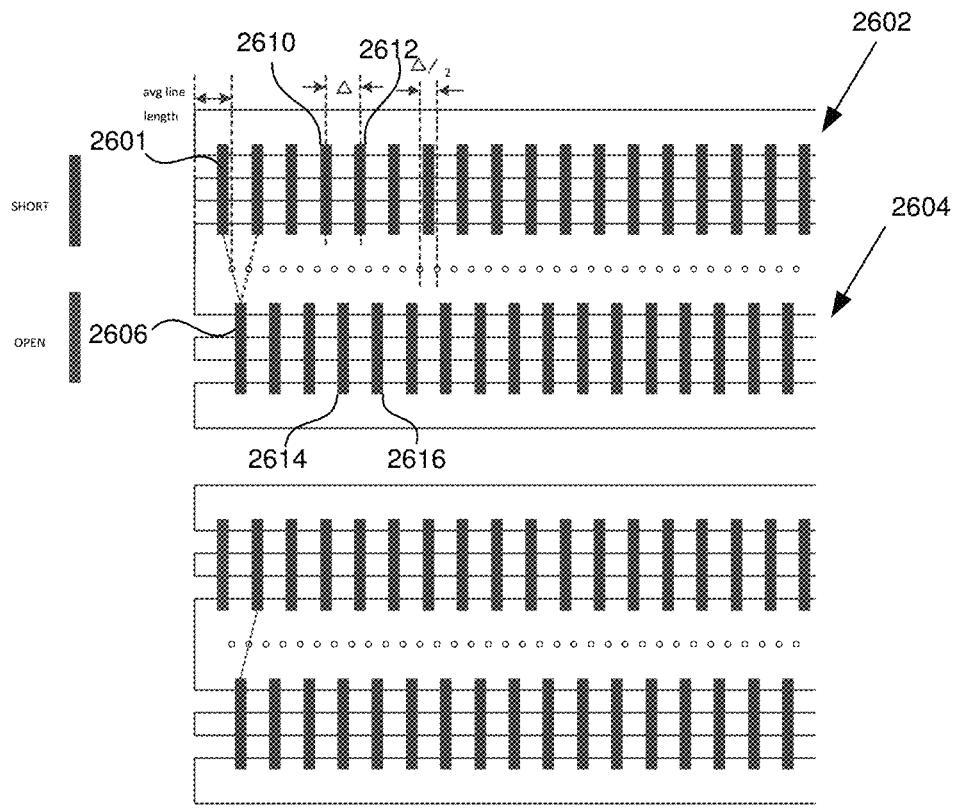
FIG. 26 is an illustration showing a first switch bar on the top of an ATL a half minimum spacing closer to the end of the ATL than is the first switch bar on the bottom ATL of the same first time sequence.
Figure 26:
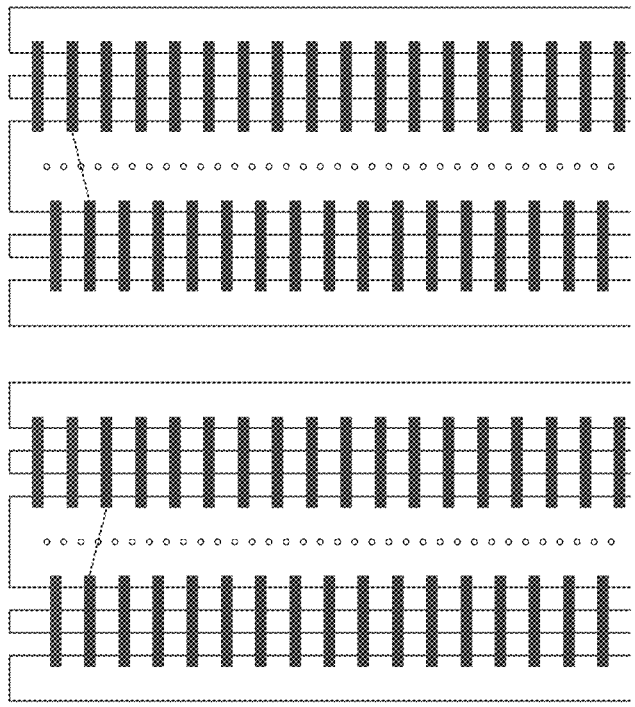

The sequence of switch closings can be seen in FIG. 26. In this figure, a pair of ATLs 2602, 2604 is shown in a sequence of switch closings, proceeding from top to bottom of the figure. As can be seen, the upper ATL 2602 has a minimum phase delay as set by all switches being in a closed state. It is pointed out that to clarify the relative locations of the switches, the switches being opened in each ATL are shown in FIG. 26 are both on the left side of each ATL, whereas, due to layout constraints in connecting to the direct and coupled ports of a Lange Coupler, the ATLs may be laid out with their connections located centro-symmetrically, as shown in FIG. 7, for example.

With continuing reference to FIG. 26, as the switches open as shown, the time/phase delay increases. However, unlike previous embodiments in which an additional switch is opened on each of the ATLs, in the current embodiment, a single switch on a single ATL is opened. The Lange Coupler, therefore, sees an average of the two delays, thereby doubling the time/phase resolution of the overall structure. As shown in FIG. 26, the minimum resolution of a single pair of adjacent switches 2610, 2612 on either ATL 2602, 2604 is denoted as "delta" whereas the spacing difference between similarly located switches 2614, 2616 on alternate ATLs 2604, 2602 will introduce a "half delta" delay.

As a person of ordinary skill will see, each of the switches in each pair of switches in the current embodiment switch independently, which requires separate control lines and a digital decoder with an additional logic level. The additional logic level increases the size of the decoder, up to doubling its area, but this is a small area price to pay for an additional level of precision (since logic gates are very small compared to ATLs and switches). In addition, the current embodiment can be used to provide the original precision, but with half as many switches, thereby saving area.

The advantages of the current embodiment are summarized below:

The improvement as shown below doubles the resolution.

a 6-bit (5.625 degrees) design will yield 7-bit resolution with no RF changes, only a digital control change.

Higher resolution is valuable, for example, for accurately compensating phase variations of the DSA in a beamformer.

When correcting for random DSA variation in a DPS, a +/−½ lsb uniformly distributed random error may occur. This yields 0.29 lsb rms error. Adding a bit of resolution reduces the "resolution error" to 0.14 lsb rms on the original lsb scale. This is important in meeting beamformer accuracy specifications.

Can provide either doubled resolution or half the switches for the original resolution.

At very high frequencies, the switch physical size limits resolution possible with the method in which the switch location delays are not staggered. This may be the only way to obtain needed resolution in that case.

The thermometer code digital control size doubles for this improvement, but digital gates are small and cheap.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. A phase shifter comprising:
   (a) a radio frequency coupler having an input port, direct port, coupled port and isolation port;
   (b) a ground conductor substantially encircling at least the radio frequency coupler;
   (c) a first central trace coupled to the direct port;
   (d) a first plurality of switches coupled at intervals between the first central trace and the ground conductor;
   (e) a second central trace coupled to the coupled port; and
   (f) a second plurality of switches coupled at intervals between the second central trace and the ground conductor.

2. The phase shifter of claim 1, wherein the first central trace has a first distal end coupled to the ground conductor and the second central trace has a second distal end coupled to the ground conductor.

3. The phase shifter of claim 1, wherein the first central trace has a first distal end coupled to the ground conductor through a first resistance and the second central trace has a second distal end coupled to the ground conductor through a second resistance.

4. The phase shifter of claim 3, wherein the switches of the first and second plurality of switches comprise field-effect transistors having an ON resistance, $R_{ON}$, and the first and second resistances each have a resistance approximately equal to the ON resistance, $R_{ON}$, of one of the field-effect transistors.

5. The phase shifter of claim 1, wherein the switches of the first and second plurality of switches comprise field-effect transistors (FETs) having an ON resistance, $R_{ON}$, and the FETs along the length of the first and second central traces have different $R_{ON}$ values.

6. The phase shifter of claim 5, wherein the $R_{ON}$ values of the FETs decrease along the length of first and second central traces relative to the direct port and the coupled port, respectively.

7. The phase shifter of claim 1, wherein an electrical length of the first central trace is determined by a closed switch of the first plurality of switches closest to the direct port, and an electrical length of the second central trace is determined by a closed switch of the second plurality of switches closest to the coupled port.

8. The phase shifter of claim 7, wherein secondary reflections to the direct port are reduced by one or more other closed switches of the first plurality of switches farther from the direct port than the closest closed switch.

9. The phase shifter of claim 7, wherein secondary reflections to the coupled port are reduced by one or more other closed switches of the second plurality of switches farther from the coupled port than the closest closed switch.

10. The phase shifter of claim 1, wherein the switches of the first and second plurality of switches comprise field-effect transistors (FETs), and the FETs are tapered in size along the length of the first and second central traces.

11. The phase shifter of claim 10, wherein the FETs taper in increasing size along the length of the first and second central traces relative to the direct port and the coupled port, respectively.

12. The phase shifter of claim 1, wherein a first subset of the first plurality of switches and a second subset of the first plurality of switches are positioned on opposite sides of the first central trace, and a first subset of the second plurality of switches and a second subset of the second plurality of switches are positioned on opposite sides of the second central trace.

13. The phase shifter of claim 12, wherein the first and second subsets of the first plurality of switches are aligned in pairs on opposite sides of the first central trace, and the first and second subsets of the second plurality of switches are aligned in pairs on opposite sides of the second central trace.

14. The phase shifter of claim 12, wherein the first and second subsets of the first plurality of switches are staggered with respect to each other on opposite sides of the first central trace, and the first and second subsets of the second plurality of switches are staggered with respect to each other on opposite sides of the second central trace.

15. The phase shifter of claim 1, wherein the first and second central traces each have two longitudinal sides, and further including:
   (a) a first ground section spaced apart from and along a first longitudinal side of the first central trace;
   (b) a second ground section spaced apart from and along a second longitudinal side of the first central trace;
   (c) a third ground section spaced apart from and along a first longitudinal side of the second central trace; and
   (d) a fourth ground section spaced apart from and along a second longitudinal side of the second central trace.

16. The phase shifter of claim 15, wherein at least one of the first ground section and second ground section is parallel to the first central trace, and at least one of the third ground section and fourth ground section is parallel to the second central trace.

17. The phase shifter of claim 15, wherein the spacing of at least one of the first ground section and second ground section with respect to the first central trace tapers, and the spacing of at least one of the third ground section and fourth ground section with respect to the second central trace tapers.

18. The phase shifter of claim 1, further including an externally switched reactance coupled to the isolation port of the radio frequency coupler and configured to increase the resolution of the phase shifter.

19. A phase shifter comprising:
(a) a radio frequency coupler having an input port, direct port, coupled port and isolation port;
(b) a ground conductor substantially encircling at least the radio frequency coupler;
(c) a first central trace coupled to the direct port;
(d) a first plurality of switches coupled at intervals between the first central trace and the ground conductor;
(e) a second central trace coupled to the coupled port; and
(f) a second plurality of switches coupled at intervals between the second central trace and the ground conductor;
wherein the first and second central traces, the first and second plurality of switches, and the ground conductor are arrayed such that the total impedance along each of the first and second central traces will be the same when corresponding ones of the first and second plurality of switches are closed.

20. A phase shifter comprising:
(a) a radio frequency coupler having an input port, direct port, coupled port and isolation port;
(b) a ground conductor substantially encircling at least the radio frequency coupler;
(c) a first central trace coupled to the direct port;
(d) a first plurality of switches coupled at intervals between the first central trace and the ground conductor;
(e) a second central trace coupled to the coupled port; and
(f) a second plurality of switches coupled at intervals between the second central trace and the ground conductor;
wherein the phase shifter provides a programmable time delay as a function of a selected electrical length of the first and second central traces.

* * * * *

UNITED STATES PATENT AND TRADEMARK OFFICE
CERTIFICATE OF CORRECTION

PATENT NO. : 12,184,255 B2  
APPLICATION NO. : 18/355327  
DATED : December 31, 2024  
INVENTOR(S) : John Birkbeck et al.

It is certified that error appears in the above-identified patent and that said Letters Patent is hereby corrected as shown below:

In the Specification

In the CROSS-REFERENCE TO RELATED APPLICATIONS:

Column 1, Lines 9-10, change "U.S. patent application Ser. No." to --U.S. Patent Application No.--.

Column 1, Lines 15-16, change "U.S. patent application Ser. No." to --U.S. Patent Application No.--.

Column 1, Line 22, change "U.S. patent application Ser. No." to --U.S. Patent Application No.--.

Column 1, Lines 27-28, change "U.S. patent application Ser. No." to --U.S. Patent Application No.--.

Signed and Sealed this  
Twenty-eighth Day of January, 2025

Coke Morgan Stewart  
*Acting Director of the United States Patent and Trademark Office*